(12) United States Patent
Chen et al.

(10) Patent No.: US 8,003,953 B2
(45) Date of Patent: Aug. 23, 2011

(54) MULTI-AXIS MAGNETIC LENS

(75) Inventors: Zhongwei Chen, San Jose, CA (US);
Weiming Ren, San Jose, CA (US);
Kenichi Kanai, Palo Alto, CA (US);
Xuedong Liu, Cupertino, CA (US)

(73) Assignee: Hermes Microvision, Inc., Hsin-Chu (TW)

( * ) Notice: Subject to any disclaimer, the term of this patent is extended or adjusted under 35 U.S.C. 154(b) by 137 days.

(21) Appl. No.: 12/636,007

(22) Filed: Dec. 11, 2009

(65) Prior Publication Data

US 2011/0139996 A1 Jun. 16, 2011

(51) Int. Cl.
*H01J 1/50* (2006.01)
(52) U.S. Cl. .................................. 250/396 ML
(58) Field of Classification Search ........... 250/396 ML; 359/619, 618
See application file for complete search history.

(56) References Cited

U.S. PATENT DOCUMENTS

| 4,209,698 | A  | * | 6/1980  | Hoppe | 250/311 |
| 7,576,917 | B2 | * | 8/2009  | Lanio | 359/619 |
| 2009/0261266 | A1 |   | 10/2009 | Lanio |         |

OTHER PUBLICATIONS

International Search Report and Written Opinion, PCT/US2010/021722, mailed Mar. 18, 2010.

* cited by examiner

*Primary Examiner* — Kiet Nguyen
(74) *Attorney, Agent, or Firm* — Stout, Uxa, Buyan & Mullins, LLP

(57) ABSTRACT

The present invention relates to a multi-axis magnetic lens for a charged particle beam system. The apparatus eliminates the undesired non-axisymmetric transverse magnetic field components from the magnetic field generated by a common excitation coil and leaves the desired axisymmetric field for focusing each particle beam employed within the system.

14 Claims, 24 Drawing Sheets

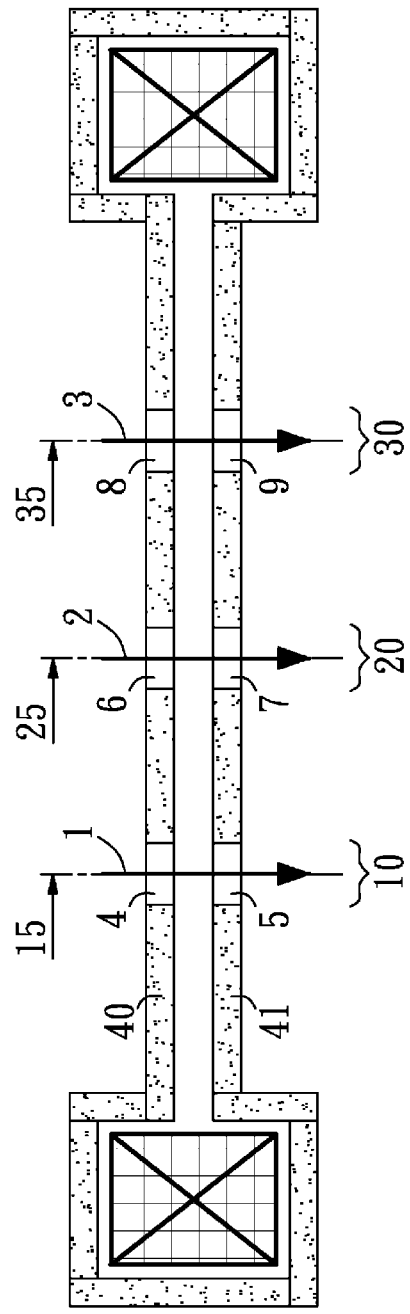
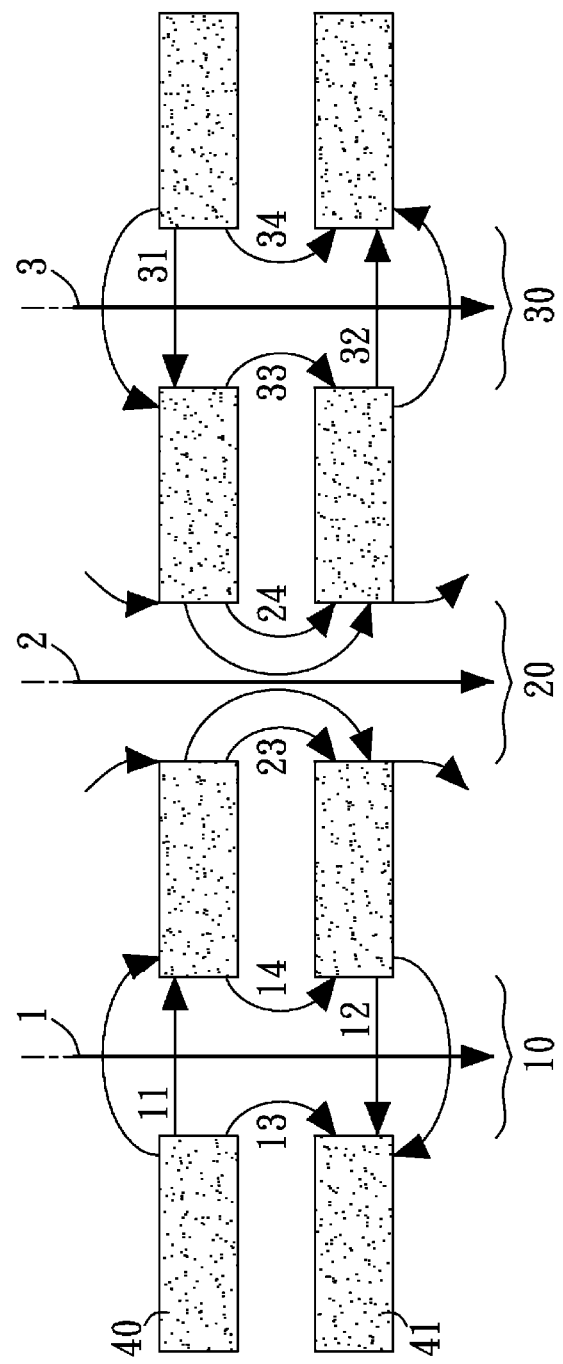
FIG. 1A (PRIOR ART)
FIG. 1B (PRIOR ART)

MULTI-AXIS MAGNETIC LENS

CROSS-REFERENCE TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

FIELD OF THE INVENTION

The present invention relates to a multi-axis magnetic lens for a charged particle beam system. More specifically, it relates to a charged particle optics apparatus with a non-magnetic material gap between a magnetic insert ring and a magnetic conductor plate for eliminating non-axisymmetric transverse magnetic field due to asymmetric structure of a plurality of charged particle beams.

BACKGROUND OF THE INVENTION

Defect inspection of semiconductor wafers and masks for IC manufacturing is an accepted production process for yield enhancement. The information obtained from a wafer defect inspection tool can be used to flag defective dies for repair, or improve wafer processing parameters. The systems used for inspection were typically optical system in nature and such systems were limited in resolution due to the wavelength of measuring light. Electron beam systems can have much higher resolution than optical systems because the wavelength of the electron can be in the angstrom regime. However, the electron beam systems are limited in speed at which they can inspect wafers. Depending on the scanning frequency, the present systems with throughput varying from 20 to 40 square cm per hour have been achieved. Thus to inspect an entire 300 mm diameter silicon wafer, at least 18 hours will be required. In order to achieve a throughput of several wafers per hour, (which is suitable for in-line use in a semiconductor fabrication facility), the idea of multi-axis magnetic lens system for charged particle beam was introduced.

The first multi electron beam patent was granted to Maekawa et al. in 1973 for throughput improvement exposure system. The apparatus consists of one common exciting coil and two magnetic conductor plates with a plurality of through holes for the corresponding particle beam passing, which was proposed in U.S. Pat. No. 3,715,580 and was illustrated in FIG. 1A. Between a pair of holes in the upper magnetic conductor plate 40 and the corresponding hole in the lower magnetic conductor plate 41 such as hole 4 and hole 5, a sub-lens such as 10 is formed. The two magnetic conductor plates 40 and 41 are the pole pieces of these sub-lenses. For this type lens, the magnetic field of the sub-lens is fundamentally different from each other in magnetic field distribution and magnetic field strength (FIG. 1B).

Comparing with the conventional single-axis magnetic lens, the field distribution of the sub-lens degenerates from axial symmetry to rotation symmetry and/or n-fold symmetry (FIG. 1B, FIG. 1C). As a result, besides the axisymmetric field, the non-axisymmetric transverse field components called as high order harmonics such as dipole field (11, 12, 31, 32 in FIG. 1B) and quadrupole field 42 (FIG. 1C) appear. The dipole field deflects the particle beams, makes the beam land on the imaging plane with an additional transverse shift, an additional tilt angle and additional aberrations. The quadrupole field adds astigmatism to the beam. The appearance of the harmonics requires the optics includes at least one additional element generating the same type field to compensate its influence.

The magnetic flux passing through the center sub-lens 20 and peripheral sub-lens 10, are not same because they are located in the area of the two magnetic conductor plates 40 and 41 with different magnetic flux. This difference makes the axisymmetric field called as round lens field of the center sub-lens 20 a little different from that of the peripheral sub-lens 10, 30. As a result, the center beam 2 passing through the center sub-lens 20 and the peripheral beams 1 and 3 passing through the peripheral sub-lenses 10 and 30 respectively are not focused at the same imaging plane (FIG. 1A).

Many scientists who followed Maekawa's foot steps have tried many methods to eliminate the influence of the harmonics and the round lens field difference among all the sub-lenses.

U.S. Pat. No. 6,750,455 of Lo et al. reduces the dipole field itself by using plurality of dummy holes to improve the local structure symmetry of the sub-lens the beam will really pass.

U.S. Pat. No. 6,777,694 of Haraguchi compensates the dipole field influence by inserting a deflector group in each sub-lens hole.

U.S. Pat. No. 6,703,624 of Haraguchi et al. nulls the round lens field difference among all the sub-lenses by changing the pole piece diameter or the pole piece gap size of the sub-lens to control the magnetic flux leakage in the individual sub-lens.

U.S. Pat. No. 6,703,624 of Haraguchi et al. and U.S. Pat. No. 7,253,417 of Frosien et al. compensate the round lens field difference by inserting an auxiliary round coil or an electrostatic lens in each sub-lens.

These previous methods were either making the magnetic conductor plate become larger and the multi-axis magnetic lens system bulky or making it complicated. The present invention will provide a better solution that eliminates high order harmonics along the charged particle beam path. Thereafter it provides a high throughput inspection tool for semiconductor yield enhancement.

SUMMARY OF THE INVENTION

The present invention relates to a multi-axis magnetic lens for a charged particle beam system. The apparatus eliminates the undesired non-axisymmetric transverse magnetic field components called as high order harmonics from the magnetic field generated by a common excitation coil and leaves the desired axisymmetric field called as round lens field for focusing each particle beam employed within the system. However, it would be recognized that the invention has a much broader range of applicability.

The present invention provides several embodiments that eliminates the high order harmonics of the magnetic field on charged particle beam path. The high order harmonics of the magnetic field are generated by geometric symmetry variation when lens structure is altered from single axis to multi-axis.

The first embodiment utilizes a higher permeability magnetic insert ring in each hole of each sub-lens to create permeability discontinuity. In this case, the magnetic insert rings inserted in the upper and lower magnetic conductor plates function as a pair of pole pieces of the sub-lens. This design weakens the non-axisymmetric distribution of magnetic scalar potential inside each magnetic ring and as a result reduces the high order harmonics of the magnetic fields.

The second embodiment further separates the magnetic insert ring in the first embodiment from the inner sidewall of the hole by a non-magnetic material gap to form magnetic permeability discontinuity. The magnetic insert ring is aligned with the hole. The magnetic insert rings inserted in the upper and lower magnetic conductor plates function as a pair of pole pieces of the sub-lens. This design makes an efficient shield of the high order harmonics of the magnetic field within the sub-lens. A multilayer gap including alternately placed non-magnetic material gap and magnetic material gap makes the shielding more efficient.

The third embodiment introduces magnetic shielding tubes that sit on/under a vacuum gap or a non-magnetic material lining outside above the upper magnetic conductor and below the lower magnetic conductor plate. Each magnetic shielding tube is aligned with each hole in each sub-lens to surround each charged particle beam path. This design makes an efficient shielding along the beam path of each beam from the charged particle source through the sub-lens to the imaging plane. A multilayer shielding can further improve the shielding effect.

The forth embodiment of the present invention extends the magnetic insert ring on the upper magnetic conductor plate upward to the upper magnetic shielding tube and the magnetic insert ring on the lower magnetic conductor plate downward to the lower magnetic shielding tube to cover the distance between the magnetic insert ring and the magnetic shielding tube.

The fifth embodiment of the present invention extends the magnetic insert ring on the upper magnetic conductor plate into the magnetic insert ring on the lower magnetic conductor plate as a pair of lens pole pieces. This design is for eliminating the small residual high order harmonics of the magnetic field between the upper and lower magnetic conductor plates.

The sixth embodiment introduces two magnetic shielding houses to cap the path of all the charged particle beams respectively above the upper magnetic conductor plate and below the lower magnetic conductor plate, instead of magnetically shielding each individual charged particle beam. The magnetic shielding house has a top lid and a bottom plate with polarity holes that match with the corresponding incident beams and is separated by a vacuum gap or a non-magnetic material lining from the magnetic conductor plate. This design shields out most of the undesired magnetic fields inside the house, however, there still is some magnetic field leak near the opening position close to the magnetic conductor plate.

The seventh embodiment replaces the magnetic shielding tubes or the magnetic shielding house that locates below the lower magnetic conductor plate to a magnetic shielding plate to gain a small working distance between the apparatus and the specimen.

The eighth embodiment utilizes the thickness of the non-magnetic material gap or the multilayer gap to adjust the magnetic flux leakage in each sub-lenses, and finally makes all the sub-lenses have same round lens field.

The present invention provides a nearly high order harmonics free environment for each charged particle beam in a multi-column charged particle beam system. The system could be used as condenser lens or objective lens in a multi-column apparatus.

A charged particle optics system is provided, which comprises a pair of parallel magnetic conductor plates, a common excitation coil, a plurality of magnetic insert rings, and a plurality of gaps. The pair of parallel magnetic conductor plates includes a plurality of charged particle beam passing through holes, wherein each hole in the upper plate of the pair of parallel magnetic conductor plates is aligned with the corresponding hole in a lower plate of the pair of parallel magnetic conductor plates. Each of the plurality of magnetic insert rings is inserted in and aligned with each hole in each magnetic conductor plate. Each gap is inserted between the outer sidewall of each magnetic insert ring and the inner sidewall of each hole in each magnetic conductor plate. In this way, a plurality of sub-lens modules are formed, wherein each sub-lens module consists of a pair of holes, the corresponding pair of magnetic insert rings functioned as a pair of pole pieces and the corresponding pair of gaps in the upper and lower magnetic conductor plates. The common excitation coil provides magnetic flux to the plurality of sub-lens modules, wherein each sub-lens module focuses a charged particle beam.

Each gap has at least one vacuum layer or is filled with one non-magnetic material layer, and all the gaps may have the same or different thicknesses. Each gap may include a multilayer, wherein the multilayer comprises at least one magnetic layer sandwiched between two non-magnetic layers.

The charged particle optics system can further comprise a plurality of magnetic shielding tubes, wherein each shielding tube matches each hole in each sub-lens module from outside and is separated from each magnetic conductor plate by a vacuum gap or a non-magnetic lining. Each magnetic insert ring in the upper plate is extended upward to cover the distance between it and the corresponding magnetic shielding tube above the upper magnetic conductor; and each magnetic insert ring in the lower plate is extended downward to cover the distance between it and the corresponding magnetic shielding tube below the lower magnetic conductor. All of the magnetic shielding tubes on the sample side of the pair of the magnetic conductor plates may be replaced by a magnetic shielding plate or a magnetic shielding house.

The upper magnetic insert ring in the upper magnetic conductor plate is extended downward into the lower magnetic insert ring in the lower magnetic conductor plate.

BRIEF DESCRIPTION OF THE DRAWINGS

The present invention will be readily understood by the following detailed description in conjunction with the accompanying drawings, wherein like reference numerals designate like structural elements, and in which:

FIG. 1A is a schematic diagrammatic representation of a basic multi-axis lens (Prior Art).

FIG. 1B is a schematic diagrammatic representation of magnetic flux lines in the six holes of FIG. 1A (Prior Art).

DETAILED DESCRIPTION OF THE INVENTION

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention.

The present invention may be practiced without some or all of these specific details. In other instances, well known process operations are not described in detail in order not to unnecessarily obscure the present invention.

The present invention relates to a multi-axis magnetic lens for a charged particle beam system. The apparatus eliminates the undesired non-axisymmetric transverse magnetic field components from the magnetic field generated by a common excitation coil and leaves the desired axisymmetric field for focusing each particle beam employed within the system. Although all the discussion in the present invention based on a structure of 3 sub-lenses, however, it would be recognized that the invention can be applied to more than three sub-lenses and has a much broader range of applicability.

Figure 1C:
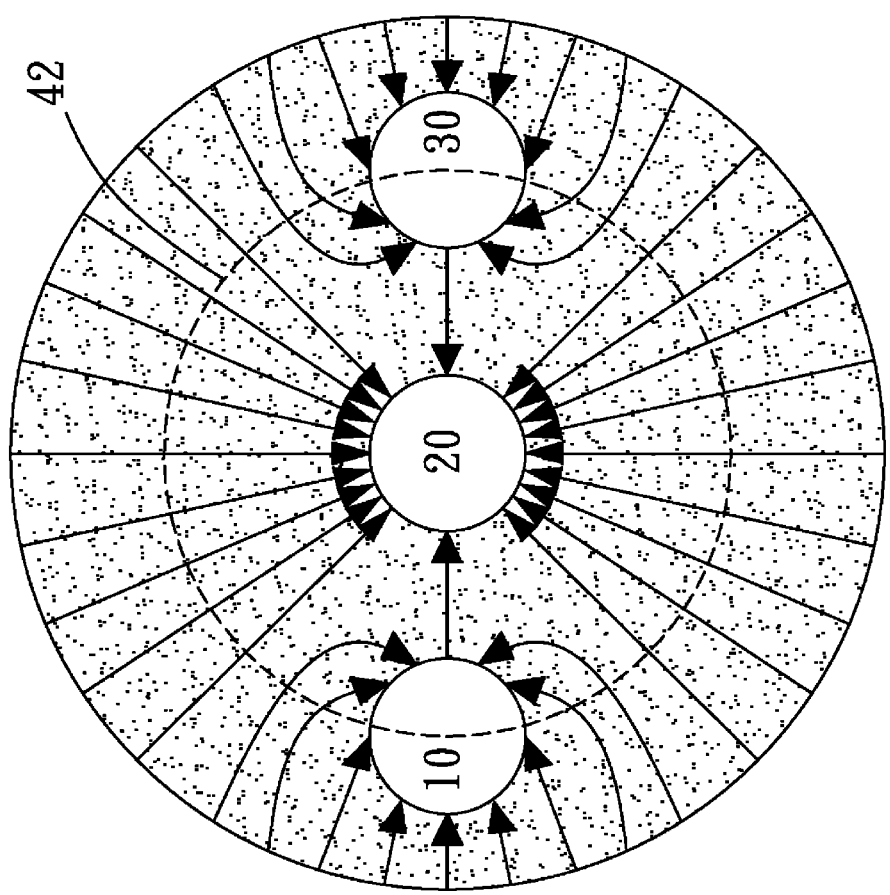
FIG. 1C is a schematic diagrammatic representation of top view of magnetic flux lines in the upper magnetic conductor plate of FIG. 1B.
Figure 2A:
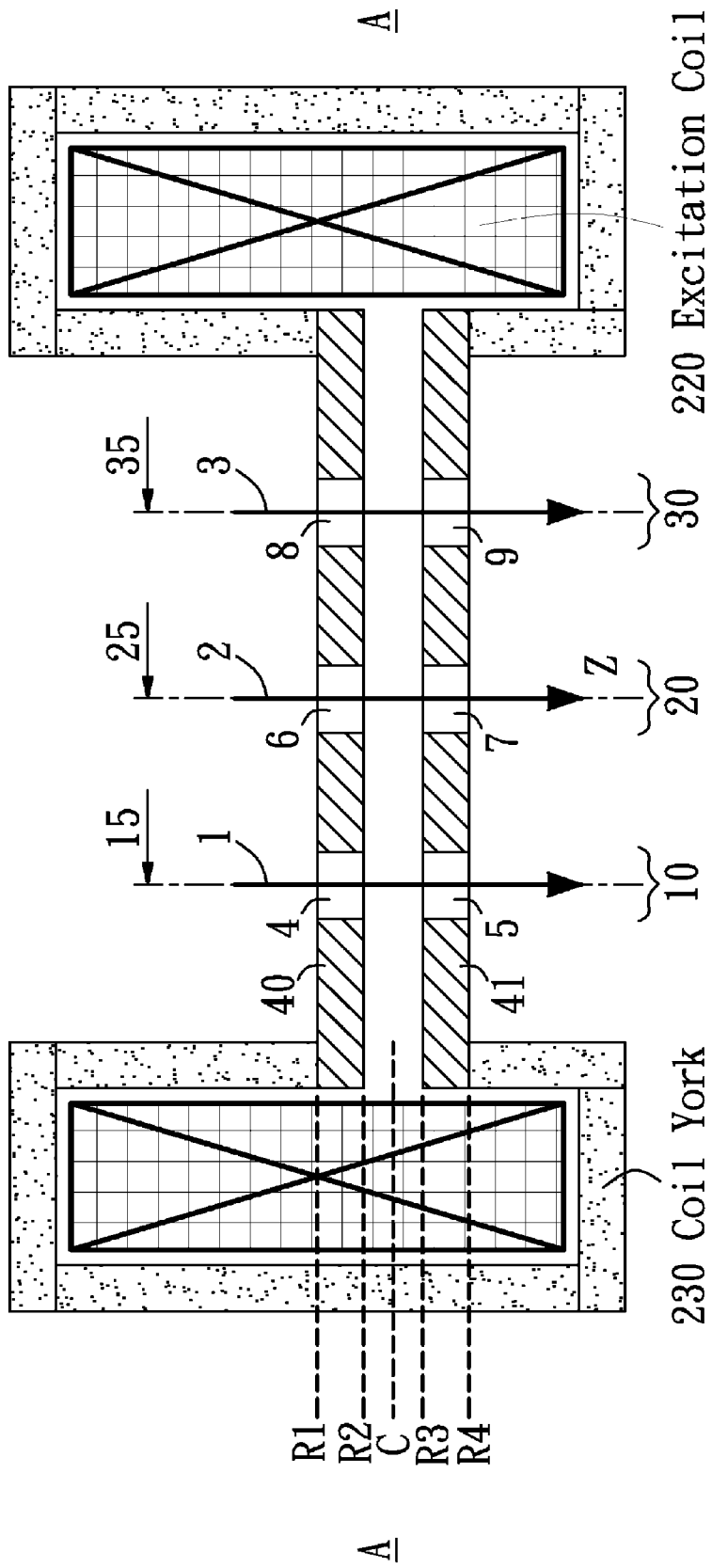
FIG. 2A is a schematic diagrammatic representation of Model 1, the fundamental structure of a multi-column system, according an embodiment of the present invention.
Figure 2B:
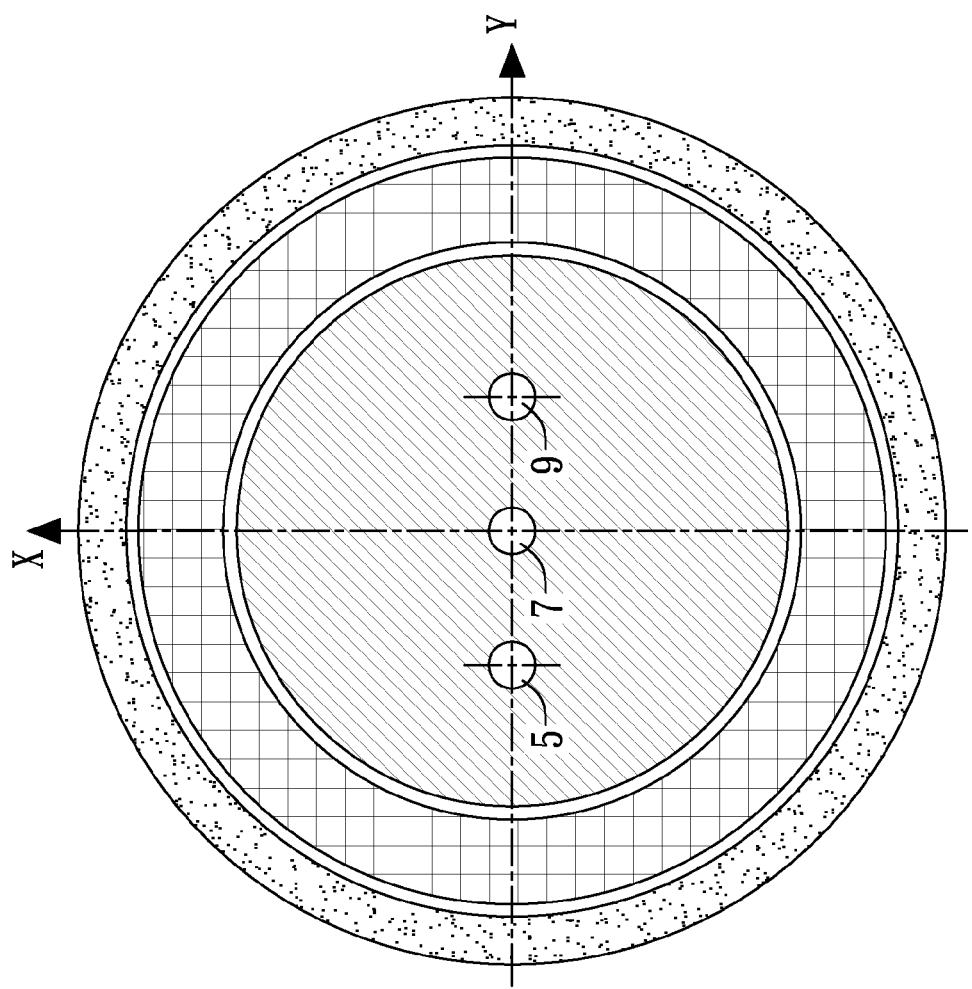
FIG. 2B is a schematic diagrammatic representation of the top view of A-A section of FIG. 2A with a round shaped structure.
Figure 2C:
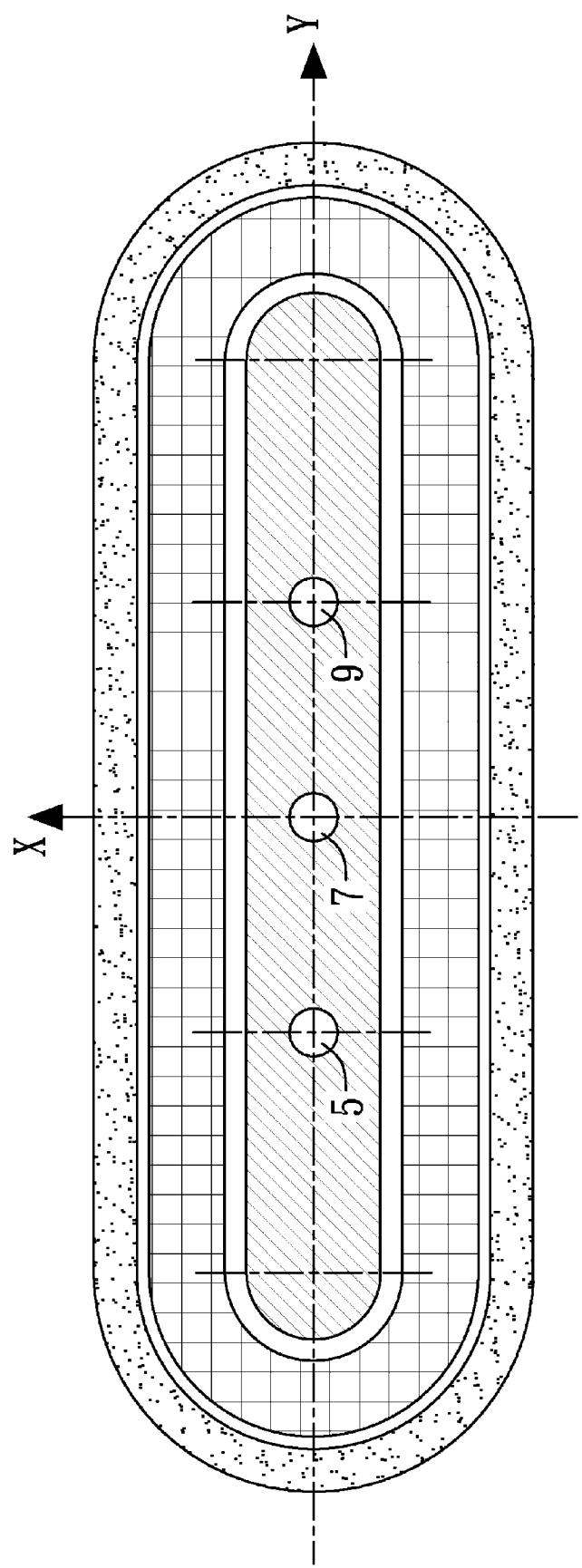
FIG. 2C is a schematic diagrammatic representation of top view of A-A section of FIG. 2A with a rectangular shaped structure.

The conventional multi electron beam lens structure or called as multi-axis lens that designed by Maekawa is illustrated in FIG. 2A. It is also a basic structure, Model 1, of the present invention. The structure has a common excitation coil 220 covered by a coil york 230 and two magnetic conductor plates 40 and 41, wherein the magnetic conductor plate 40 is an upper plate and the magnetic conductor plate 41 is a lower plate. Three holes 4, 6, 8 in the upper magnetic conductor plate 40 and the corresponding holes 5, 7, 9 in the lower magnetic conductor plate 41 form three sub-lenses or sub-lens modules 10, 20 and 30, wherein each sub-lens module focuses a charged particle beam. The common excitation coil 220 provides magnetic flux to the sub-lens modules 10, 20 and 30. The coil york 230 is made of a material that has a lower permeability for example 1000. The magnetic conductor plates 40 and 41 are made of a material with a higher permeability for example 5000 or higher. The top view of A-A section of this system is illustrated in FIG. 2B. Although the round shape structure is chosen as an example, however, the shape of the charged particle optics apparatus for a multi-column charged particle beam system in the present invention can be in any shape. A rectangular shaped apparatus is illustrated in FIG. 2C.

Figure 2D:
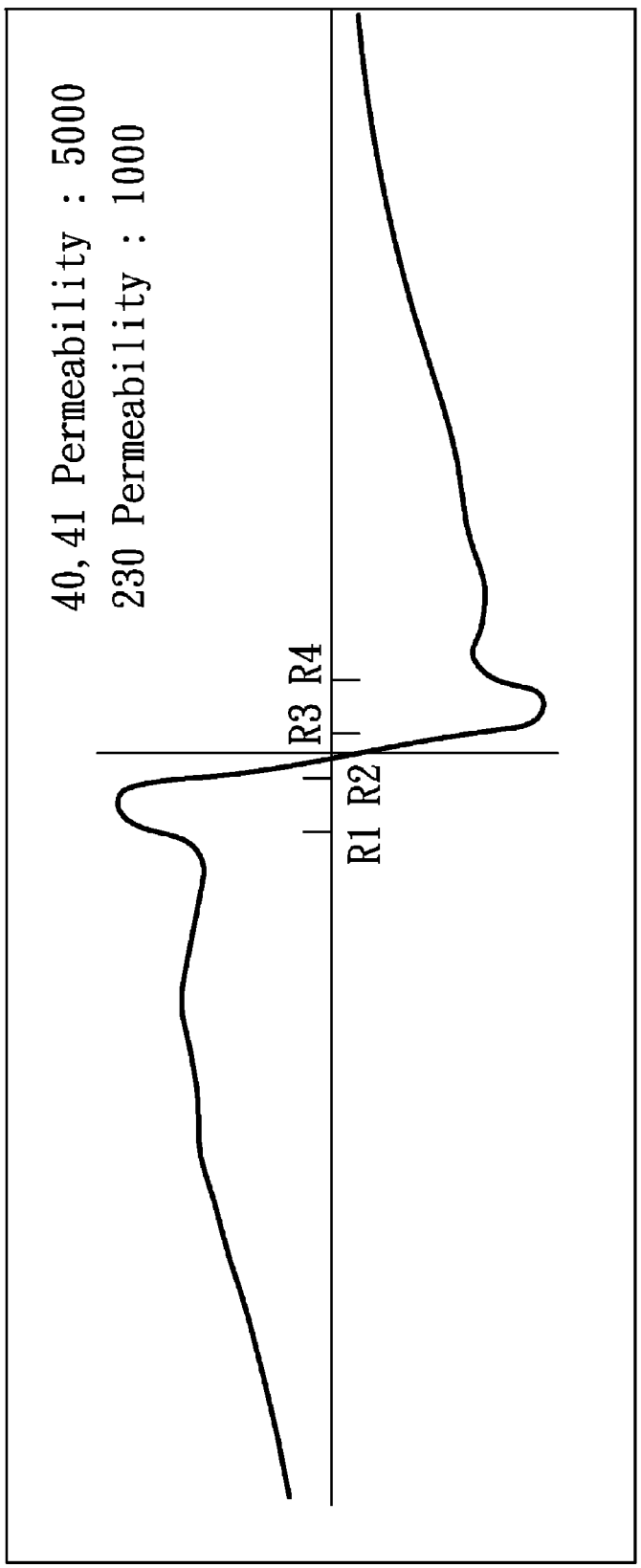
FIG. 2D is a schematic diagrammatic representation of a simulation result of the dipole field distribution along the optical axis 35 of the peripheral sub-lens 30 of Model 1 shown in FIG. 2A and FIG. 2B.
Figure 2E:
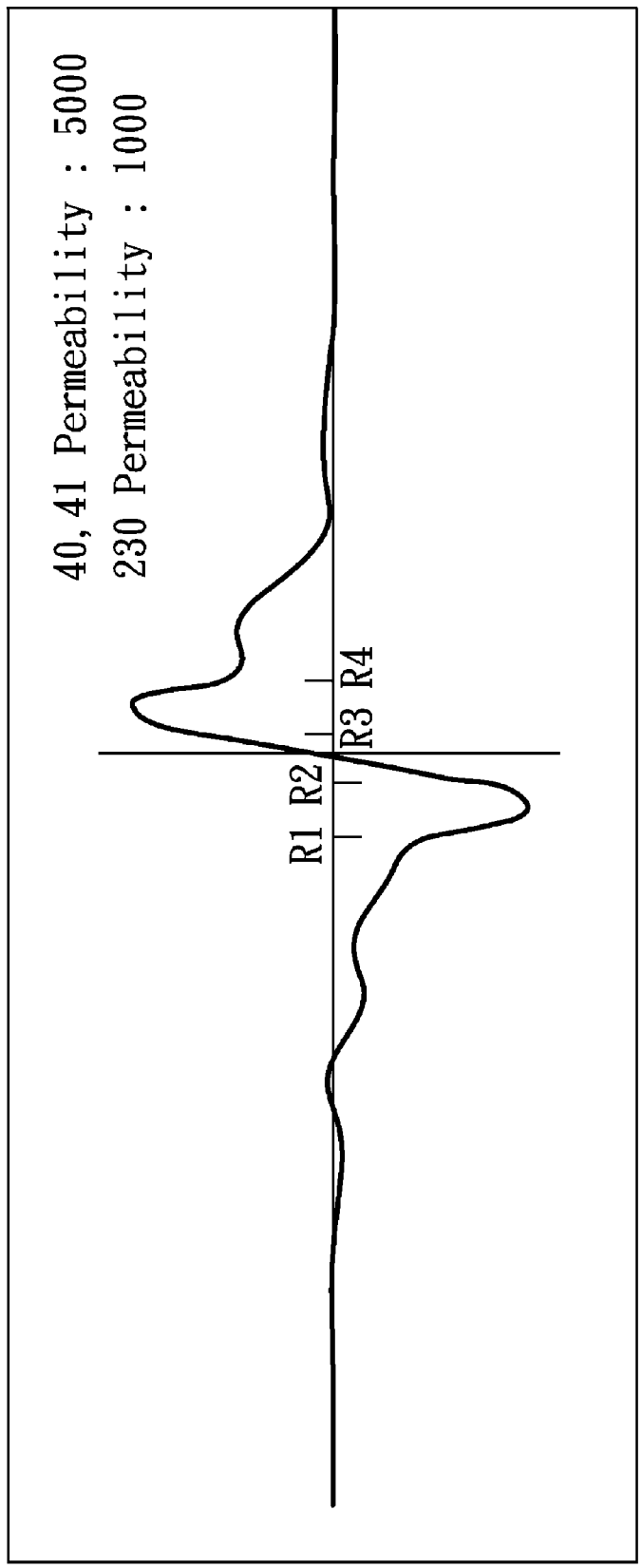
FIG. 2E is a schematic diagrammatic representation of a simulation result of the quadrupole field distribution along the optical axis 35 of the peripheral sub-lens 30 of Model 1 shown in FIG. 2A and FIG. 2B.

The peripheral sub-lenses 10 and 30 have a dipole field and a quadrupole field. FIG. 2D and FIG. 2E show the dipole field and quadrupole field distribution of sub-lens 30 along its optical axis 35, wherein permeability of plates 40, 41 is 5000 and coil york 230 is 1000. The sub-lens 20 has no dipole field because of its 2-fold symmetry. The present invention chooses the peripheral sub-lens 30 as an example to discuss the variation of the high order harmonics of the magnetic field in each embodiment. In this embodiment, although a dipole field and a quadrupole field in sub-lens 30 are solved, other peripheral sub-lens, such as 10 can also be applied. Although many high order harmonics exist in sub-lens 30, the present invention will primarily focus on the variation of the first order harmonic called as the dipole field as an example. This is because other high order harmonic fields have the same variation trend as the dipole field varies. In FIG. 2A, 4 markers R1, R2, R3, and R4 respectively correspond to the positions of the top and the bottom surface of the upper and the lower magnetic conductor plates 40 and 41. The mark C in the FIG. 2A is the center plane between the two magnetic conductor plates 40 and 41. As the previous description, the dipole field makes the beam land on the imaging plane with an additional transverse shift, an additional tilt angle and the additional aberrations; the quadrupole field adds astigmatism to the beam; and the round lens field difference makes the center beam 2 and the peripheral beams 1 and 3 not focus at the same imaging plane.

Figure 3A:
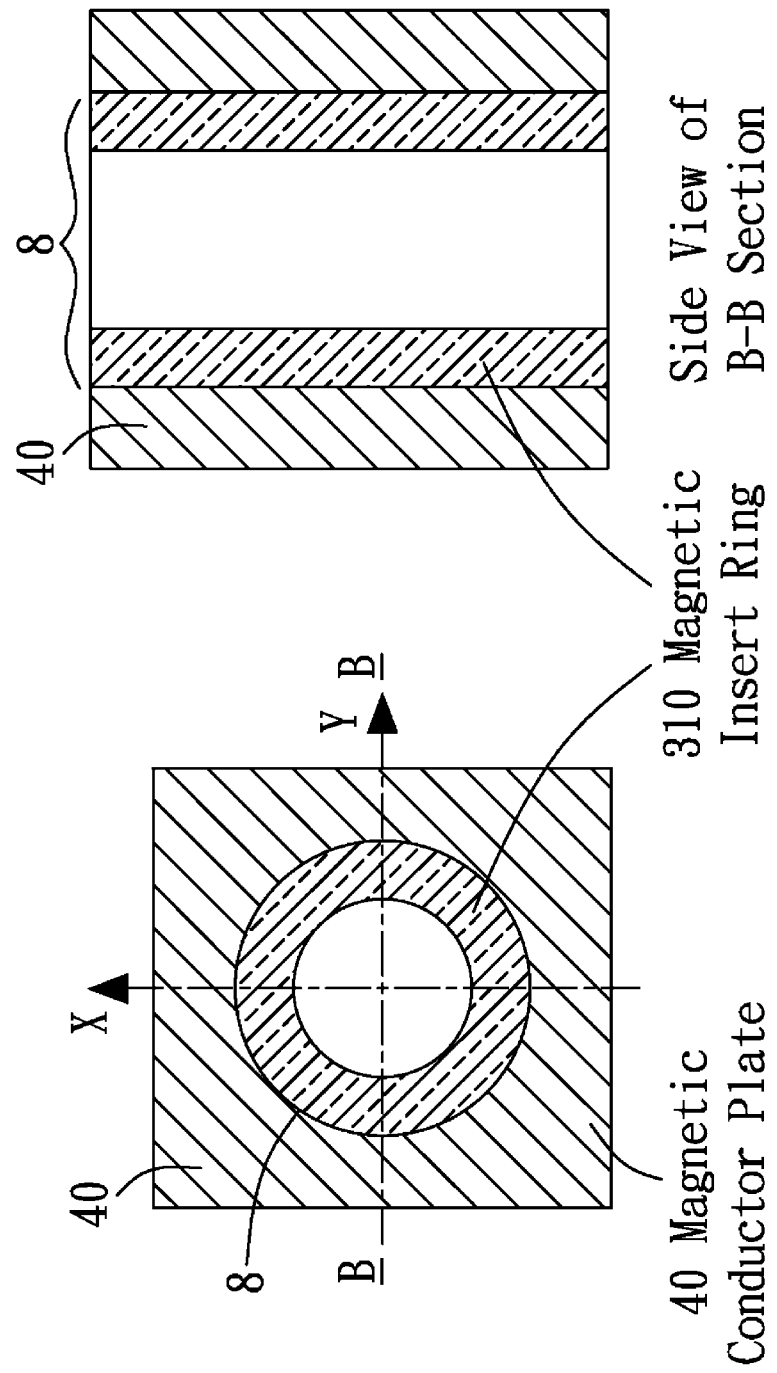
FIG. 3A is a schematic diagrammatic representation of Model 2, the structure of a magnetic insert ring inside a hole on the upper magnetic conductor plate, according an embodiment of the present invention.
Figure 3B:
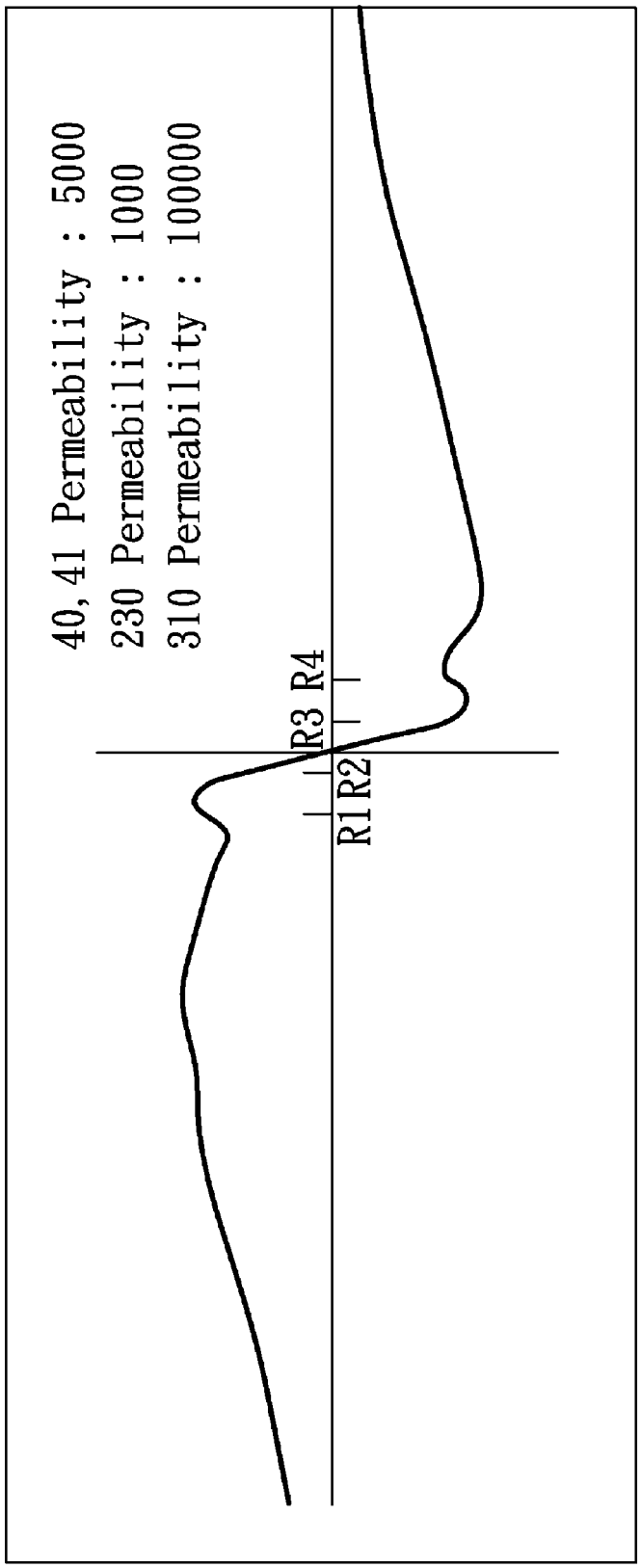
FIG. 3B is a schematic diagrammatic representation of a simulation result of the dipole field distribution along the optical axis 35 of the peripheral sub-lens 30 of Model 2.

The first embodiment of the present invention inserts a much higher permeability magnetic insert ring into each hole of each sub-lenses to weaken the non-axisymmetric distribution of magnetic scalar potential in the sub-lens, and as a result reduces high order harmonics of the transverse magnetic field. The structure of this embodiment is illustrated in FIG. 3A and called as Model 2. A magnetic conductor ring 310 is inserted in hole 8, in the upper plate 40 and its permeability is much higher than that of the magnetic conductor plates 40. For example the permeability of the magnetic insert ring is 100,000 versus the permeability of the magnetic conductor plate of 5,000. In this embodiment, the magnetic insert rings 310 inserted in the upper and lower magnetic conductor plates function as a pair of pole pieces of the sub-lens. A simulation result of the dipole field distribution on the optical axis 35 of the sub-lens 30 is illustrated in FIG. 3B, wherein permeability of plates 40, 41 is 5000, coil york 230 is 1000, and magnetic insert ring 310 is 100000. Inserting a magnetic conductor ring with a much higher permeability lowers the peak height of the dipole field distribution between R1 and R4. The magnetic insert ring can be made of Permalloy or Supermalloy. Permalloy is the term for a nickel iron magnetic alloy. Permalloy has a high magnetic permeability, low coercivity, near zero magnetostriction, and significant anisotropic magnetoresistance. Supermalloy is also a nickel iron based alloy with even higher magnetic permeability.

Figure 4A:
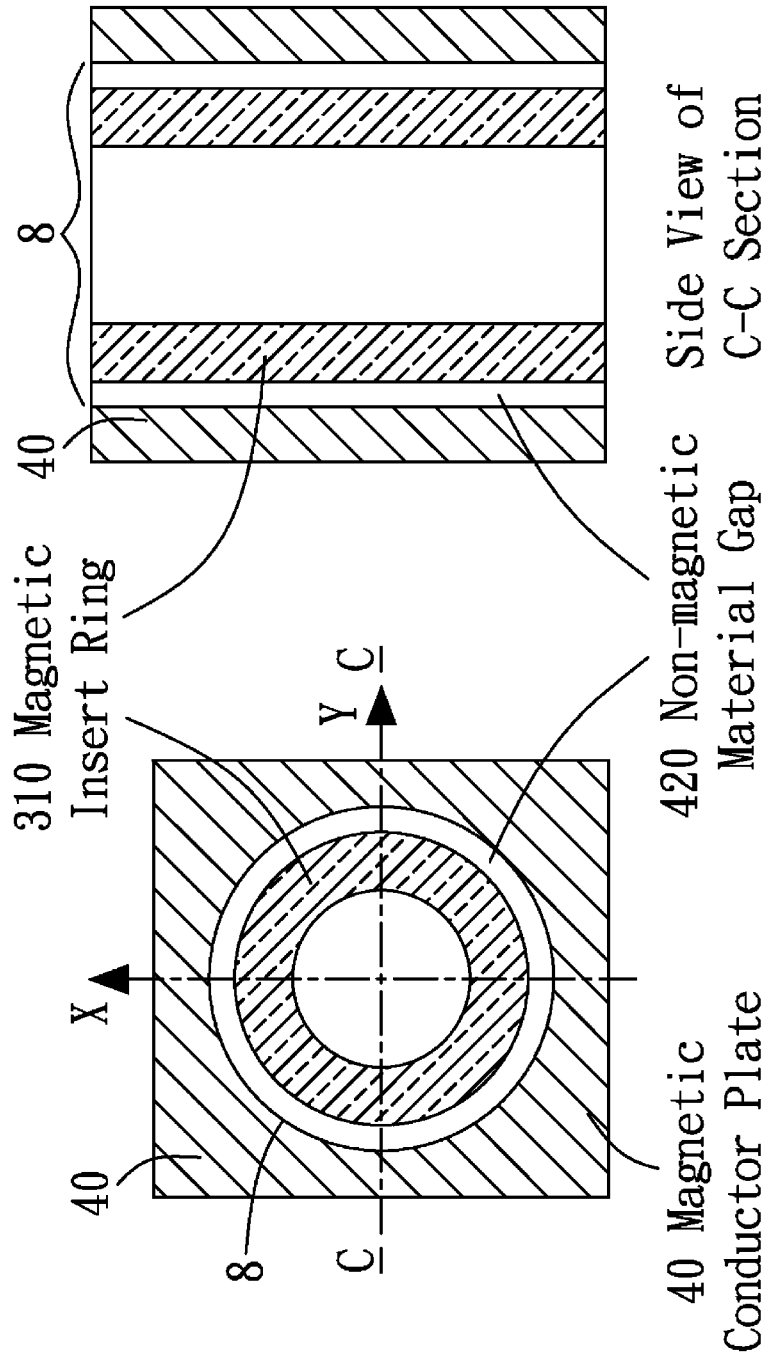
FIG. 4A is a schematic diagrammatic representation of Model 3, the structure of a magnetic insert ring and non-magnetic material gap on the upper magnetic conductor plate, according an embodiment of the present invention.
Figure 4B:
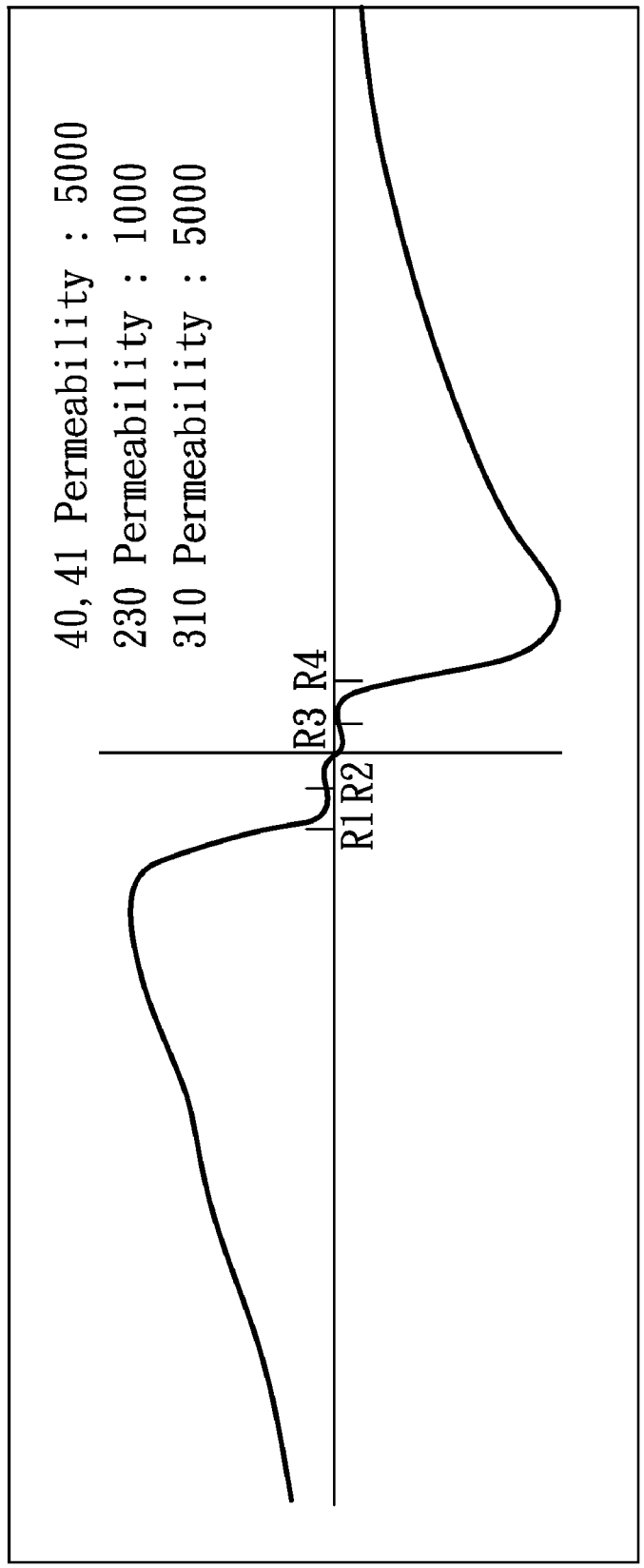
FIG. 4B is a schematic diagrammatic representation of a simulation result of the dipole field distribution along the optical axis 35 of the peripheral sub-lens 30 of Model 3.

The second embodiment of the present invention inserts a much higher permeability magnetic insert ring and a non-magnetic material gap into each hole of each sub-lens. The magnetic insert ring is aligned with the hole. The structure of this embodiment is illustrated in FIG. 4A and called as Model 3. A non-magnetic material gap 420 is introduced between the inner sidewall of hole 8 and the outer sidewall of the magnetic insert ring 310. For example, the non-magnetic gap 420 is a gap of vacuum, or filled with a ring of non-magnetic material such as aluminum, copper, and ceramics. A simulation result of the dipole field distribution on the optical axis 35 of the sub-lens 30 is illustrated in FIG. 4B, wherein permeability of plates 40, 41 is 5000, coil york 230 is 1000, and magnetic insert ring 310 is lowered to 5000. Introducing a non-magnetic material gap 420 effectively reduces the dipole field between R1 and R4. The permeability of the magnetic insert ring 310 needs not be very high, for example 5000 instead of 100000. The non-magnetic material gap 420 can efficiently help to weaken the non-axisymmetric distribution of magnetic scalar potential in the sub-lens and as a result reduce high order harmonics of the transverse magnetic field. Thickness of each gaps 420 in the holes 10, 20, and 30 can be the same or different. In this embodiment, the magnetic insert rings 310 inserted in the upper and lower magnetic conductor plates function as a pair of pole pieces of the sub-lens. The thickness of the non-magnetic material gap 420 is adjusted to keep sufficiently magnetical coupling between the magnetic insert ring and the respective magnetic conductor plate 40 or 41 and at the same time provide more azimuthally isotropic distribution of magnetic scalar potential on the inner sidewall of the magnetic insert ring.

Figure 4C:
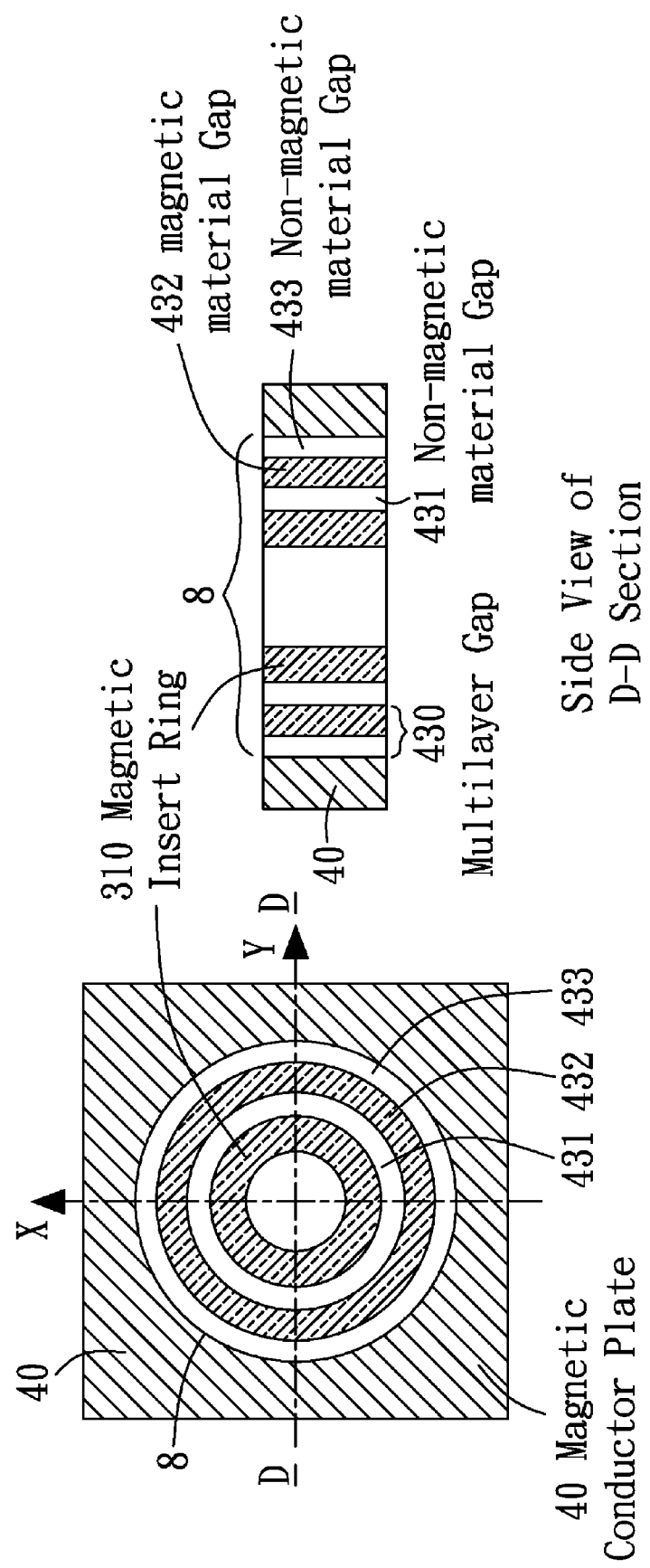
FIG. 4C is a schematic diagrammatic representation of an example of the multilayer gap, according an embodiment of the present invention.

If the non-magnetic material gap in the second embodiment is replaced by a multilayer gap which includes alternately placed non-magnetic material gap and magnetic material gap, the non-axisymmetric distribution of magnetic scalar potential in the sub-lens is weakened much more. An example of a multilayer gap model is illustrated in FIG. 4C. In FIG. 4C, two non-magnetic gaps 421, 422 and a magnetic layer 315 are interleaved between the magnetic insert ring 310 and the plates 40 or 41. In this invention, there can be two or more than two magnetic layers 315, and each magnetic layer 315 should be sandwiched by further two non-magnetic gaps.

Figure 5A:
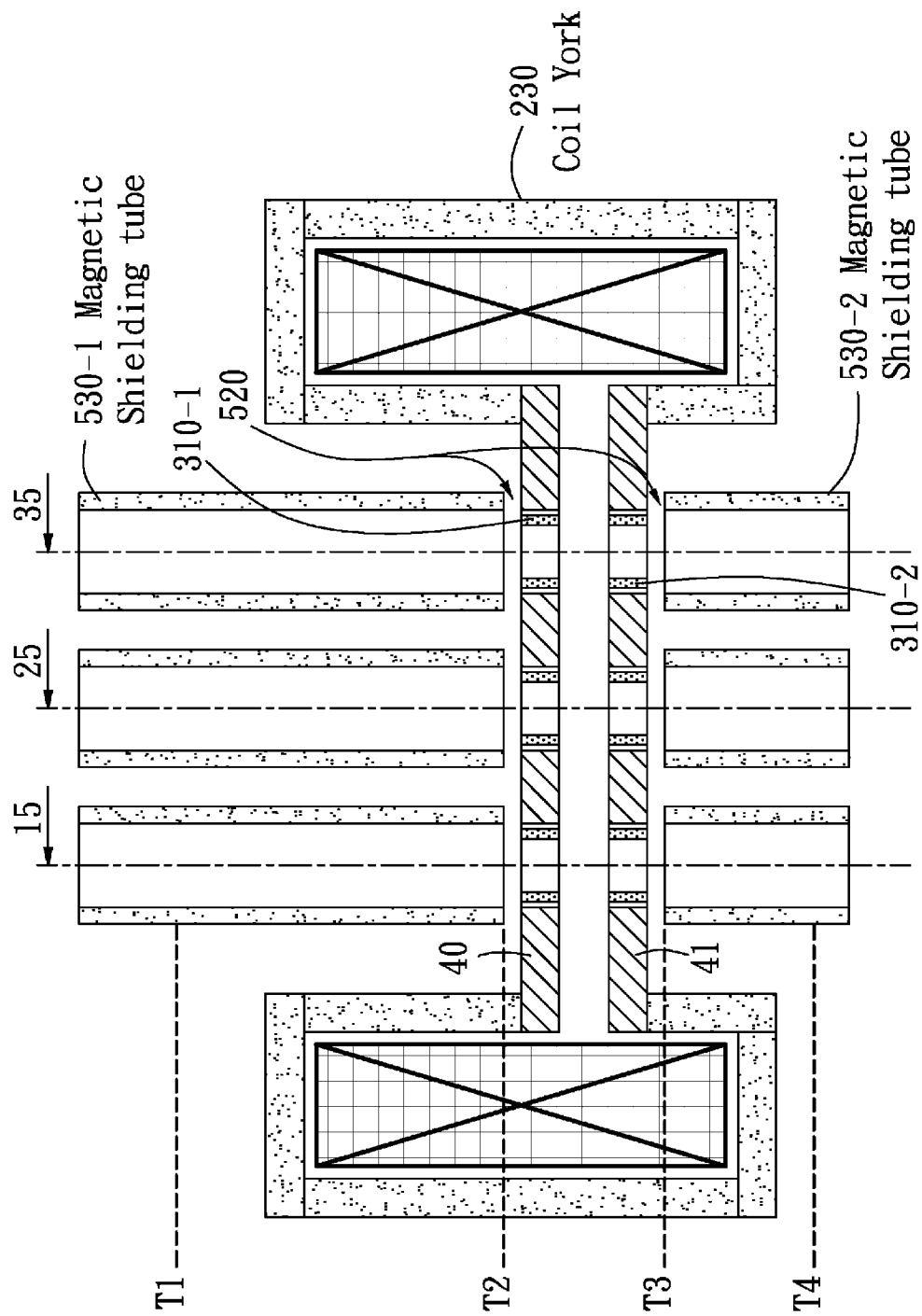
FIG. 5A is a schematic diagrammatic representation of Model 3 structure plus the magnetic shielding tubes, according an embodiment of the present invention.
Figure 5B:
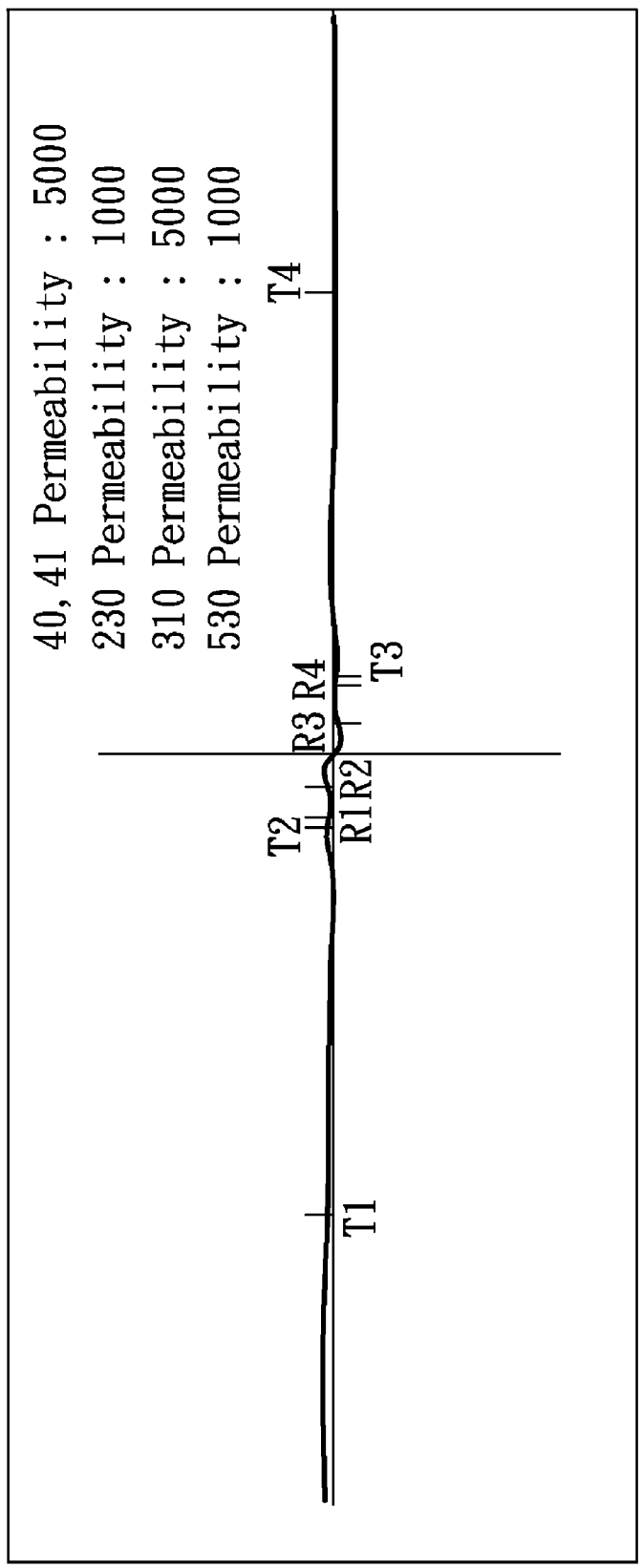
FIG. 5B is a schematic diagrammatic representation of a simulation result of the dipole field distribution along the optical axis 35 of the peripheral sub-lens 30 of the model shown in FIG. 5A.

The third embodiment of the present invention is illustrated in FIG. 5A. Two stack magnetic shielding tubes 530, respectively called as 530-1 and 530-2, are introduced to the system. This design is for removing the magnetic field in the area above the upper magnetic conductor plate 40 and below the lower magnetic conductor plate 41. Each magnetic shielding tube 530 with an inner diameter equal or larger than the non-magnetic material gap 420 is separated from the magnetic conductor plate 40, 41 by a non-magnetic lining 520 and aligned with the corresponding magnetic insert ring 310. Four more markers are added to the drawing. T1 and T2 respectively correspond to the position inside and at the bottom end of the magnetic shielding tube 530-1 located above the upper magnetic conductor plates 40. T3 and T4 respectively correspond to the positions at the top end of and inside the magnetic shielding tube 530-2 located below the lower magnetic conductor plate 41. A simulation result of the dipole field distribution on the optical axis 35 of the sub-lens 30 is illustrated in FIG. 5B, wherein permeability of plates 40, 41 is 5000, coil york 230 is 1000, magnetic insert ring 310 is 5000, and magnetic shielding tubes 530 is 1000. The magnetic shielding tube 530 with the non-magnetic lining 520 together effectively eliminates the dipole field within the magnetic shielding tube 530 along the charged particle beam path. The non-magnetic lining 520 is a gap of vacuum, or made of non-magnetic material such as aluminum, copper, and ceramics.

Figure 6A:
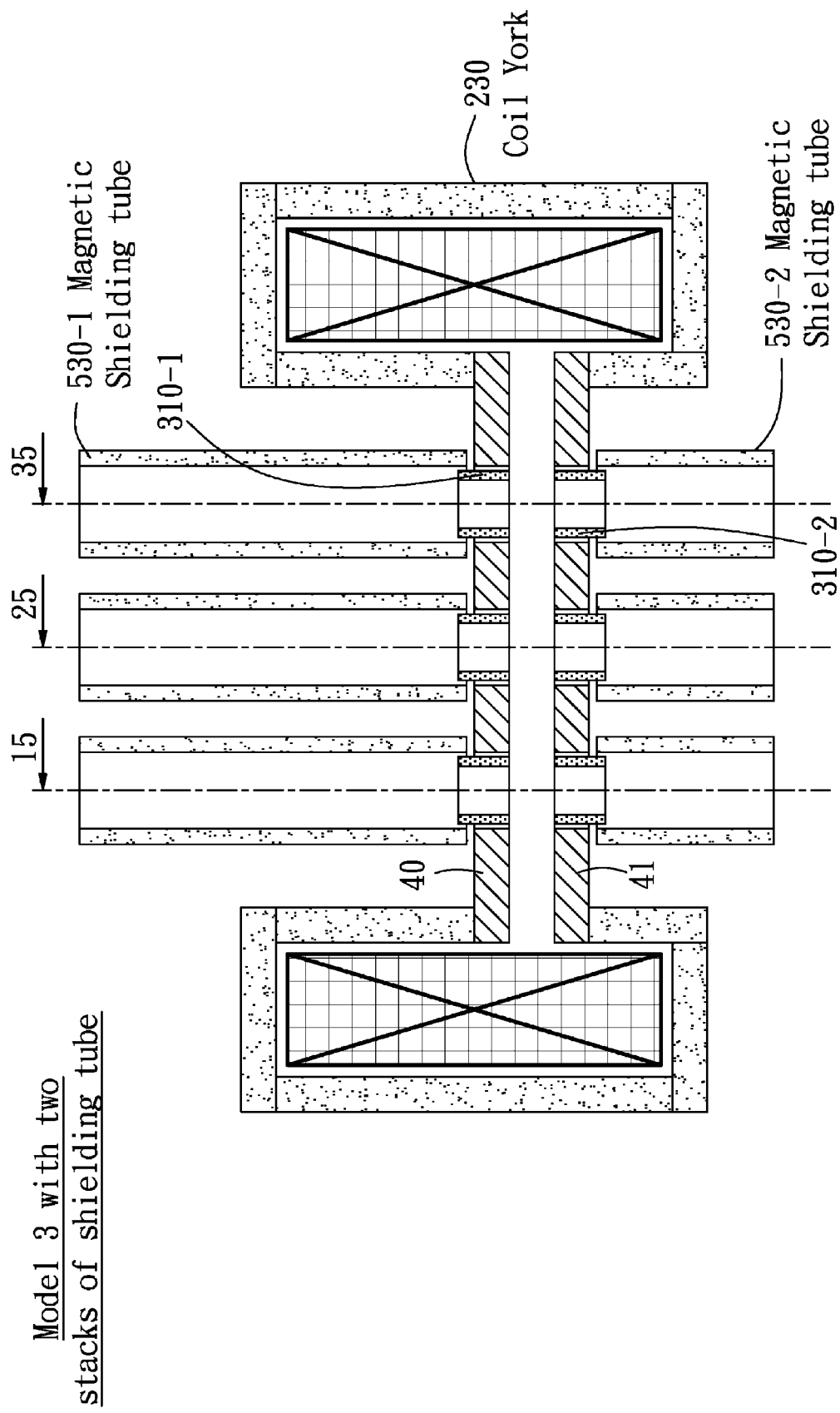
FIG. 6A is a schematic diagrammatic representation of model 3 structure plus the magnetic shielding tubes, wherein the magnetic insert ring is extended into the magnetic shielding tube according an embodiment of the present invention.
Figure 6B:
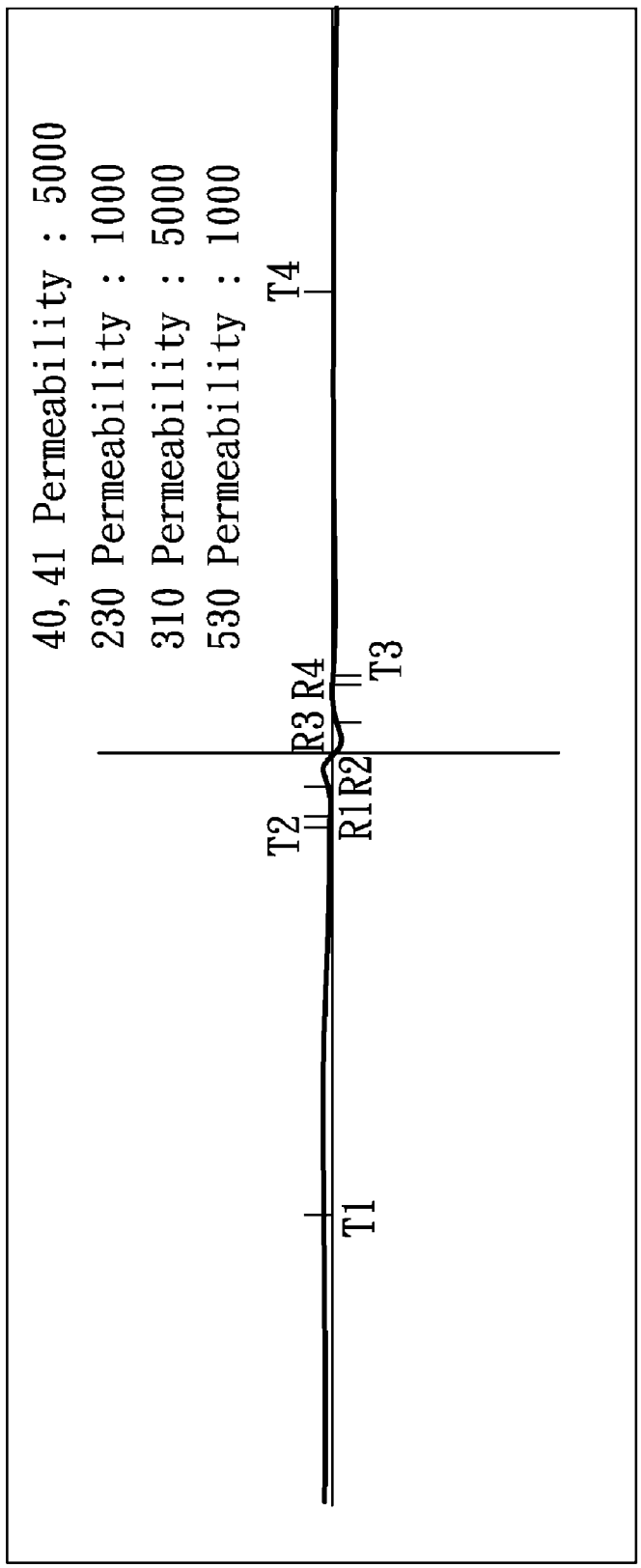
FIG. 6B is a schematic diagrammatic representation of a simulation result of the dipole field distribution along the optical axis 35 of the peripheral sub-lens 30 of the model shown in FIG. 6A.
Figure 7:
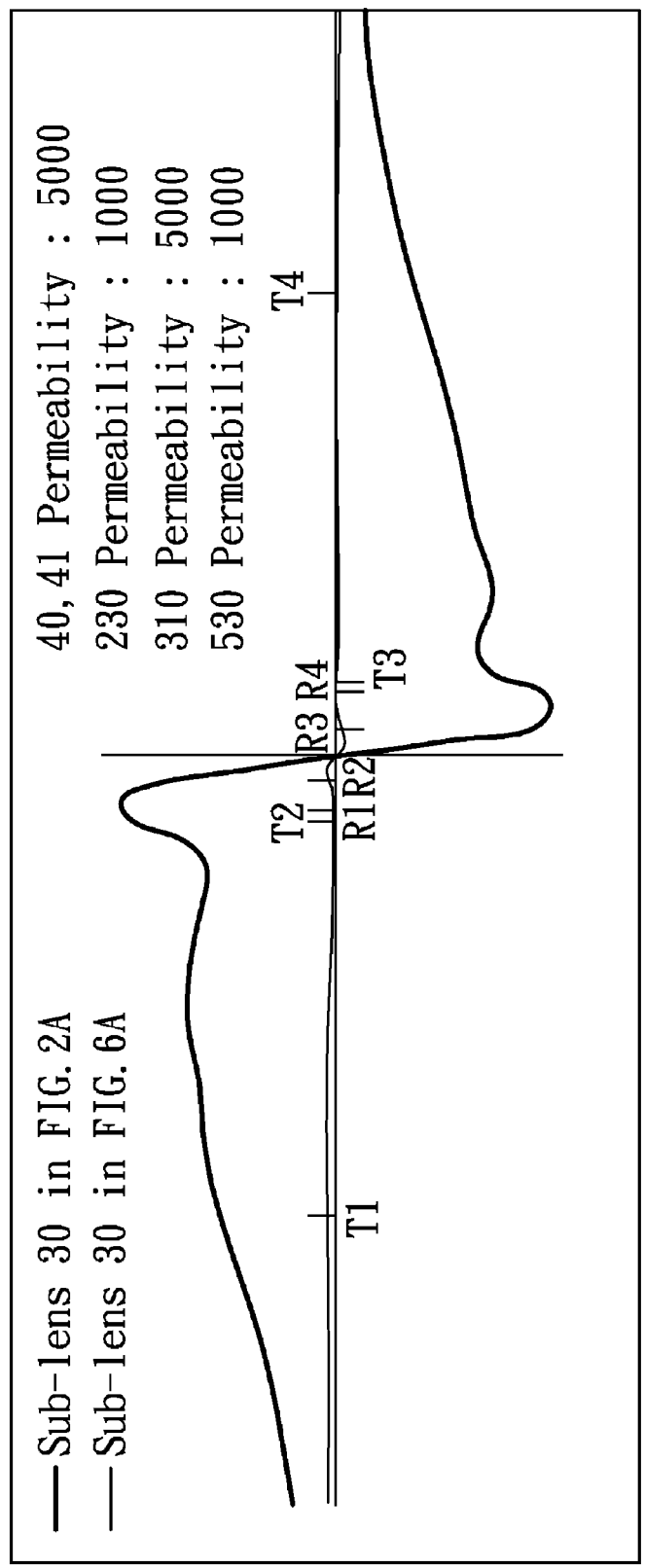
FIG. 7 is a schematic diagrammatic representation of dipole field comparison of the peripheral sub-lens 30 in Model 1 shown in FIG. 2A and the model shown in FIG. 6A.

The forth embodiment of the present invention is illustrated in FIG. 6A. The magnetic insert ring 310-1 on the upper magnetic conductor plate 40 is extended upward to the magnetic shielding tube 530-1 and the magnetic insert ring 310-2 on the lower magnetic conductor plate 41 is extended downward to the lower magnetic shielding tube 530-2 to cover the gap created by the non-magnetic lining 520. The extended magnetic insert ring 310-1 and 310-2 can cover the gap either from inside or outside the magnetic shielding tube 530-1 or 530-2. A simulation result of the dipole field distribution on the optical axis 35 of the sub-lens 30 is illustrated in FIG. 6B, wherein permeability of plates 40, 41 is 5000, coil york 230 is 1000, magnetic insert ring 310 is 5000, and magnetic shielding tubes 530 is 1000. FIG. 7 illustrates the dipole field comparison between the original structure Model 1 in FIG. 2A and the present embodiment in FIG. 6A. The dipole field along the beam path is effectively reduced except the bump between the two magnetic conductor plates 40 and 41.

Figure 8A:
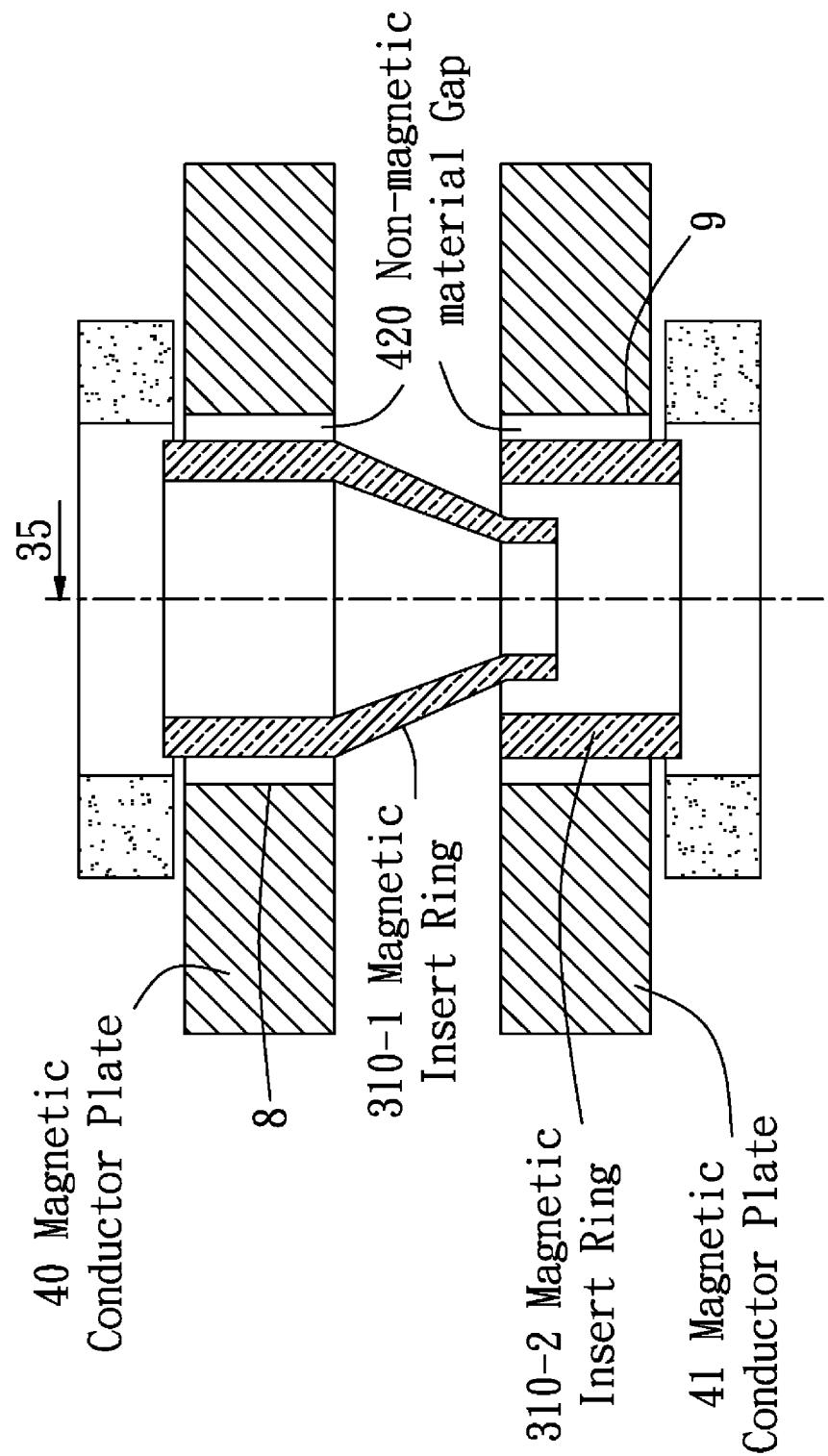
FIG. 8A is a schematic diagrammatic representation of Model 4, the structure of a magnetic insert ring and a non-magnetic gap in each hole of the magnetic conductor plate, wherein the magnetic insert ring on the upper magnetic conductor plate is extended into the magnetic insert ring on the lower magnetic conductor plate.
Figure 8B:
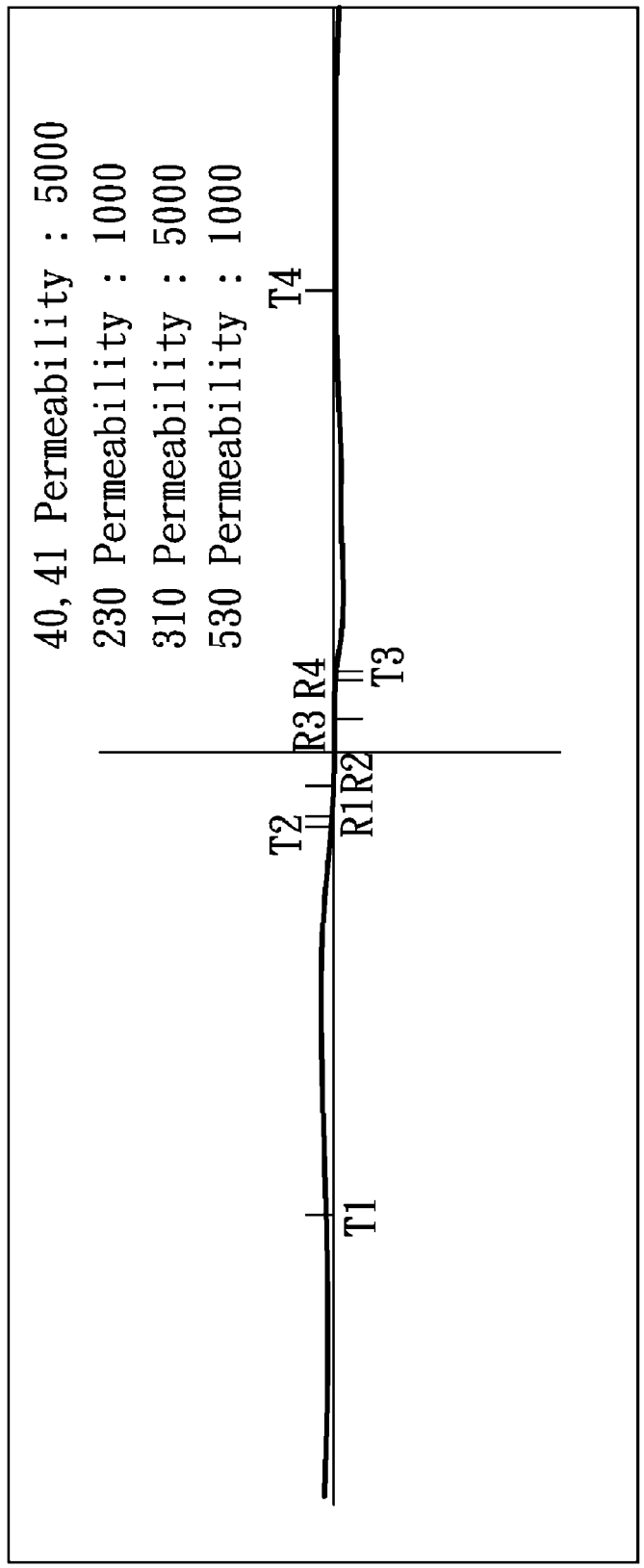
FIG. 8B is a schematic diagrammatic representation of a simulation result of the, dipole field distribution along the optical axis 35 of the peripheral sub-lens 30 of the model 4 shown in FIG. 8A.
Figure 9:
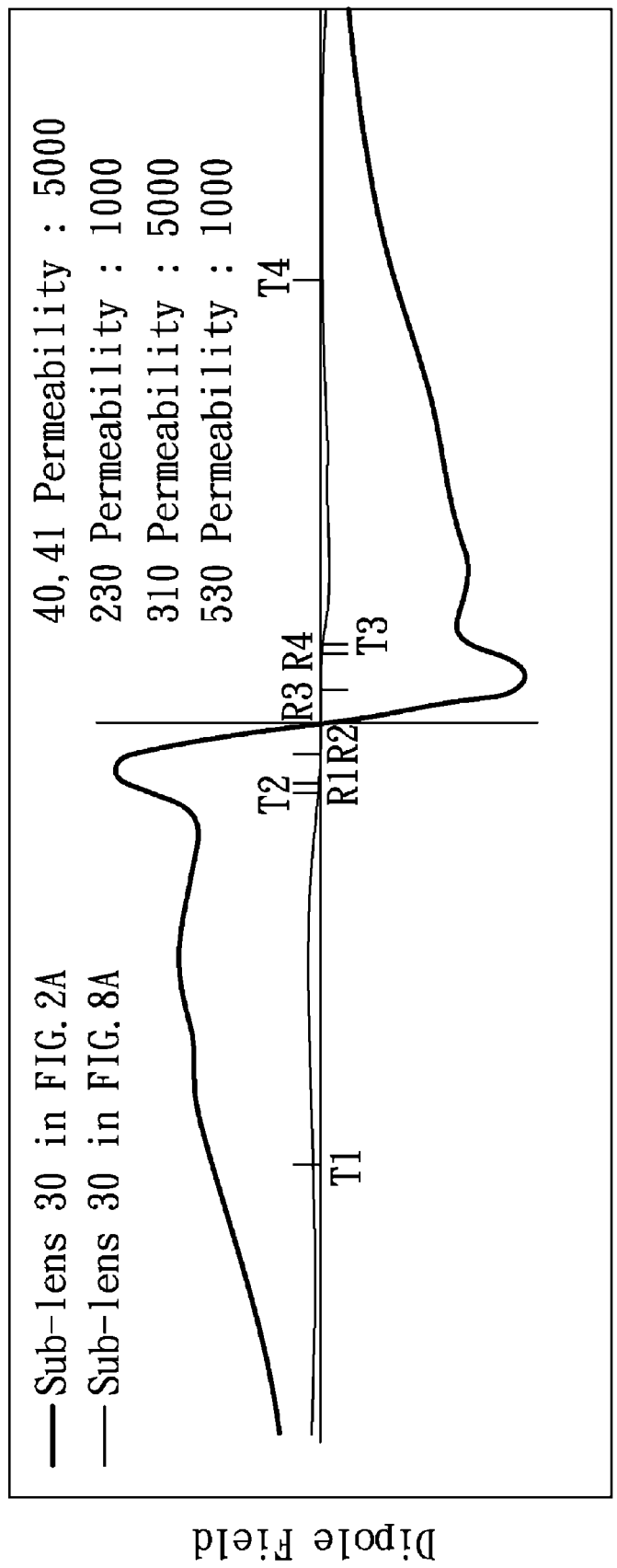
FIG. 9 is a schematic diagrammatic representation of dipole field comparison of the peripheral sub-lens 30 in Model 1 shown in FIG. 2A and Model 4 shown in FIG. 8A.

The fifth embodiment of the present invention is illustrated in FIG. 8A. This design is for eliminating the small residual high order harmonics of the transverse magnetic field between the magnetic conductor plates 40 and 41. The magnetic insert ring 310-1 inside the upper magnetic conductor plate 40 is extended into the magnetic insert ring 310-2 inside the lower magnetic conductor plate 41. As a matter of fact, the magnetic insert rings inserted in the upper and lower magnetic conductor plates are functioned as a pair of pole pieces of the sub-lens. A simulation result of the dipole field distribution on the optical axis 35 of the sub-lens 30 is illustrated in FIG. 8B, wherein permeability of plates 40, 41 is 5000, coil york 230 is 1000, magnetic insert ring 310 is 5000, and magnetic shielding tubes 530 is 1000. The small residual dipole field between the magnetic conductor plates 40 and 41 is effectively removed. Again the FIG. 9 compares the dipole field distribution of the original structure Model 1 in FIG. 2A and the current structure Model 4 in FIG. 8A.

Figure 10A:
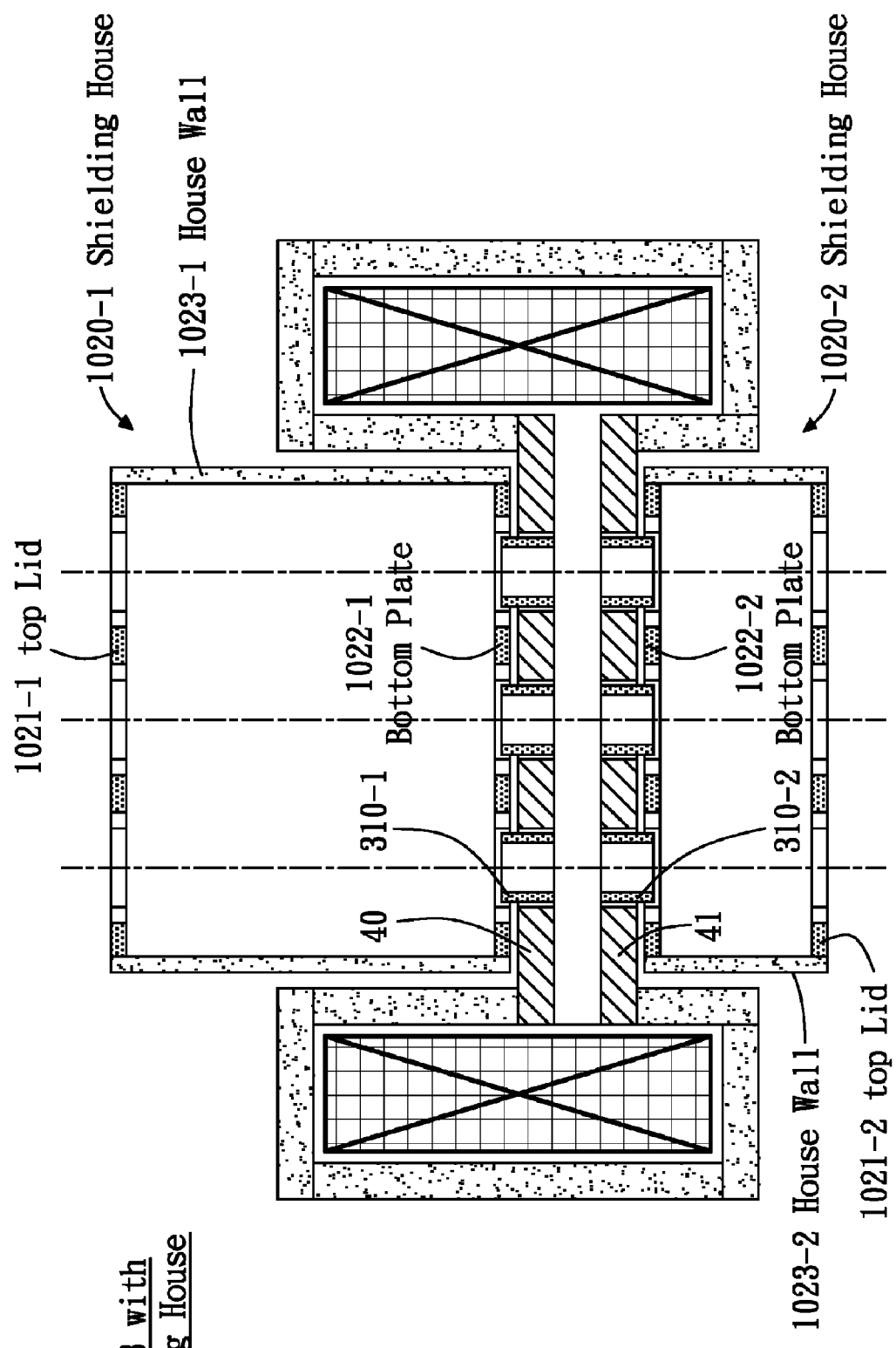
FIG. 10A is a schematic diagrammatic representation of model 3 structure plus two magnetic shielding houses covering all the charged particle beams, according an embodiment of the present invention.
Figure 10B:
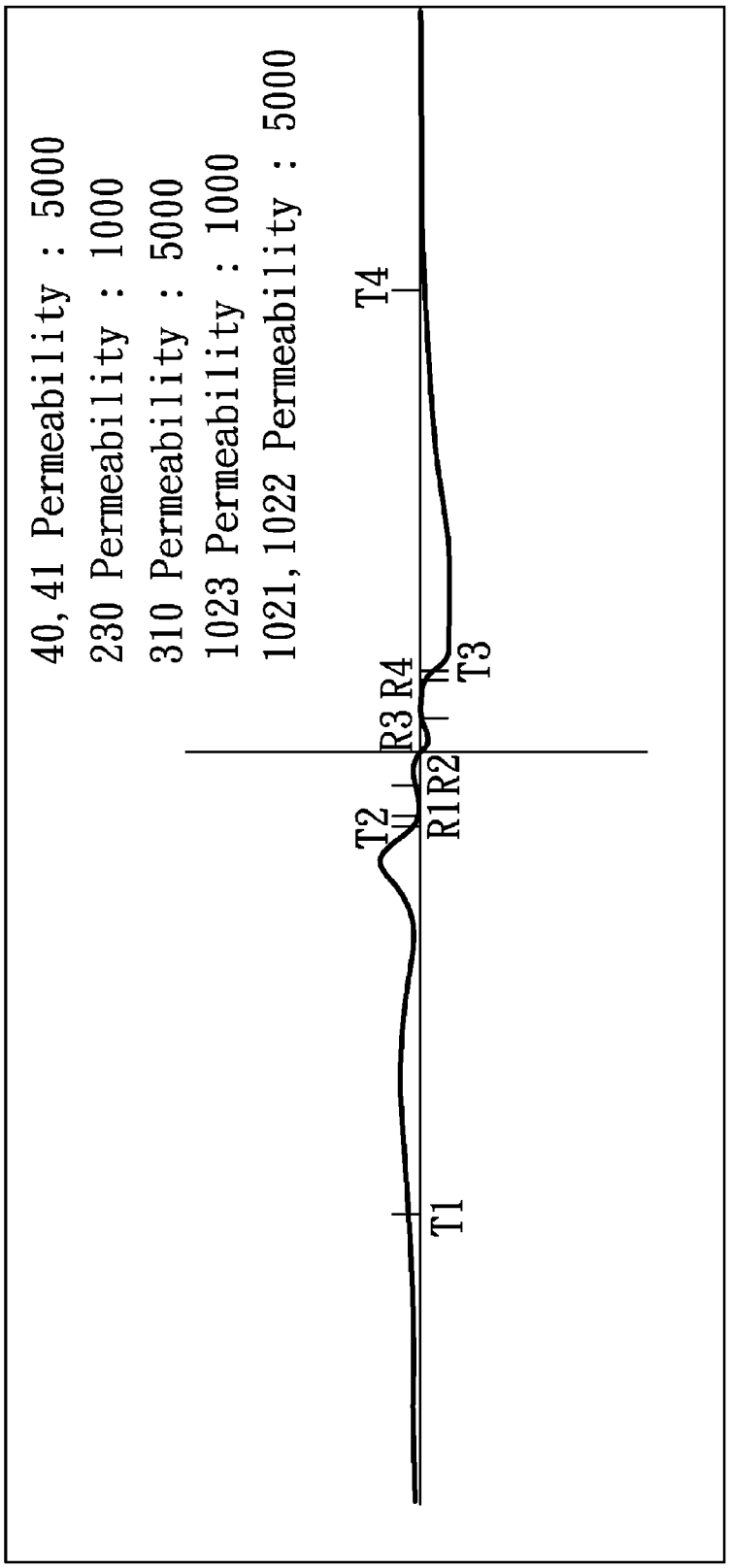
FIG. 10B is a schematic diagrammatic representation of a simulation result of the dipole field distribution along the optical axis 35 of the peripheral sub-lens 30 of the model shown in FIG. 10A.

The sixth embodiment of the present invention is illustrated in FIG. 10A. Two magnetic shielding houses 1020-1 and 1020-2 are built to cap all the sub-lenses respectively on the area above the upper magnetic conductor plate 40 and the area below the lower magnetic conductor plate 41. The idea is to build a common magnetic shielding for all the beams instead of building a magnetic shield tube for each individual beam. The simulation result of the dipole field distribution on the optical axis 35 of the sub-lens 30 is illustrated in FIG. 10B, wherein permeability of plates 40, 41 is 5000, coil york 230 is 1000, magnetic insert ring 310 is 5000, house wall 1023 is 1000, and top lid 1021 as well as bottom plate 1022 is 5000.

Figure 11:
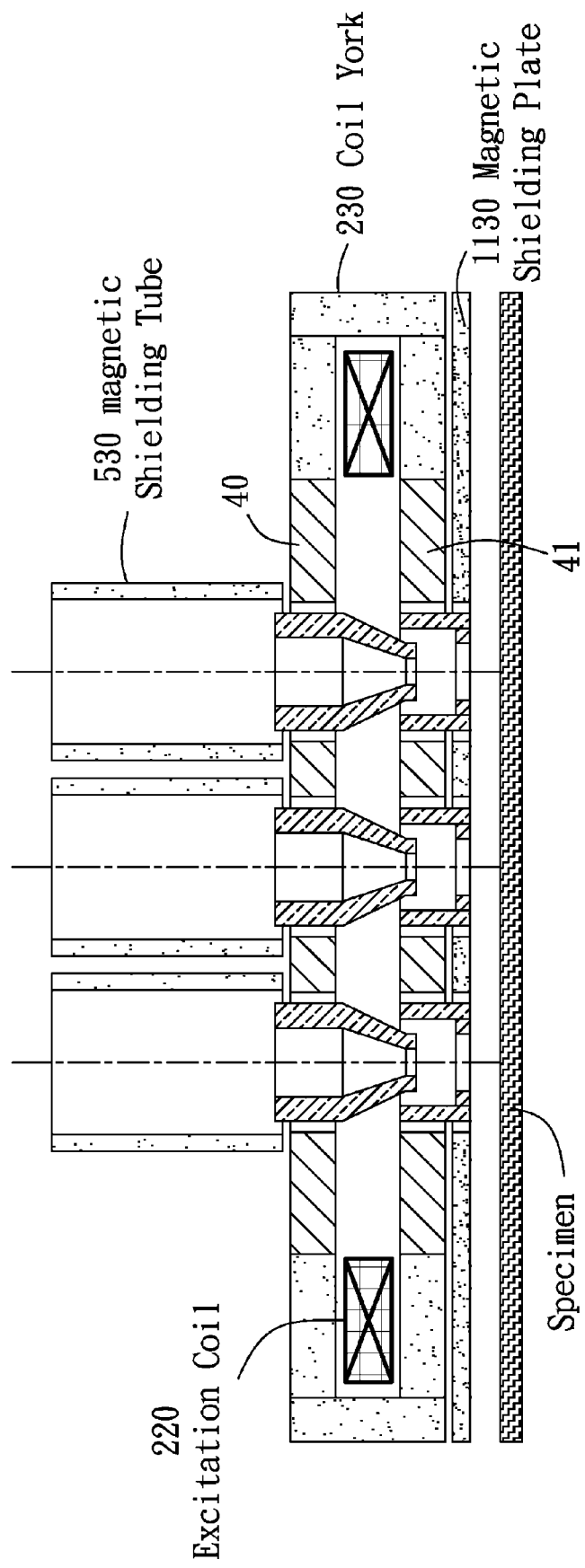
FIG. 11 is a schematic diagrammatic representation of an example in which the present invention is functioned as an objective lens.

The seventh embodiment of the present invention is illustrated in FIG. 11. The multi-column charged particle beam optical apparatus of the present invention can be used in any charged particle system as condenser lens or objective lens. The excitation coil 220 and coil york 230 of the apparatus can be formed in any shape. When the apparatus is utilized as an objective lens, the magnetic shielding tube 530-2 or the magnetic shielding house 1020-2 under the lower magnetic conductor plate 41 can be replaced by a magnetic shielding plate 1130 with plurality of holes. Each hole on the magnetic shielding plate 1130 is aligned with the corresponding hole in the lower magnetic conductor plate 41 and let the charged particle beam pass. The purpose of this replacement is to gain a small working distance between the apparatus and the specimen.

Figure 12:
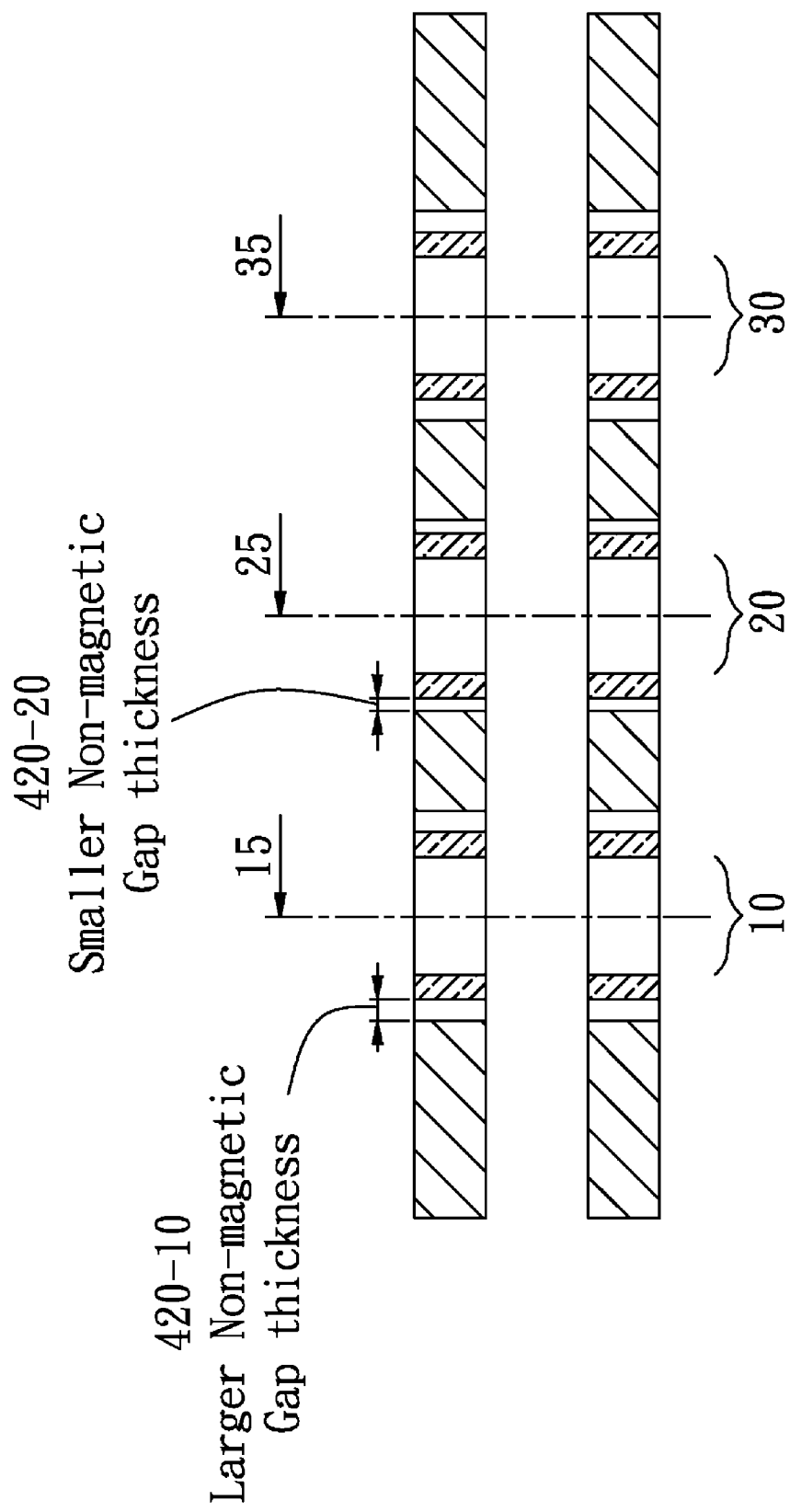
FIG. 12 is a schematic diagrammatic representation of a method to eliminate the round lens field difference among all the sub-lenses, according an embodiment of the present invention.

The last embodiment of the present invention is illustrated in FIG. 12. As the previous discussion, the magnetic flux passing through the center sub-lens 20 is different from that of the peripheral sub-lens 30 and 10. This difference makes the axisymmetric field or called as round lens field of center sub-lens 20 is different from that of the peripheral sub-lens 30 and 10. The present invention adjusts the non-magnetic material gap 420 thickness or the multilayer gap thickness in each hole to eliminate this round lens field difference among all the sub-lenses. For example, the peripheral sub-lens has a thicker non-magnetic material gap thickness in the case the peripheral sub-lens is stronger than the center sub-lens when they have the same non-magnetic material gap.

The scope of this invention is not only limited to embody only one of the specific embodiments described above, but also a combination of different embodiments. For example, this invention can be embodied with examples in FIG. 4C, FIG. 6A, and FIG. 12 simultaneously. Any person skilled in the art shall recognize any kind of such combination will be read on claim scope of this invention.

With prior art, it was necessary to make the entire magnetic conductor plates with very expensive, high permeability material to reduce the dipole field along the beam paths, and it would have still been necessary to apply dummy holes and/or additional optical components to cancel the remaining non-axisymmetric transverse field with complex calibration and adjustment for the state-of the-art applications. With the present invention employing non-magnetic material gaps, the magnetic conductor plates and the magnetic insert rings can be made with conventional, low-cost magnetic material with moderate high permeability. Structural enhancements and design tunings with the non-magnetic material gap, magnetic shielding tube, house, or plate, structure relationship between the non-magnetic material gap and other magnetic shielding structures, and multilayer structure for the non-magnetic material gap can further enhance removal of dipole field and even quadrupole field.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended.

What is claimed is:

1. A multi-axis magnetic lens, comprising:
   a pair of parallel magnetic conductor plates with a plurality of charged particle beams passing through holes, wherein each hole in the upper plate of the pair of parallel magnetic conductor plates is aligned with the corresponding hole in the lower plate of the pair of parallel magnetic conductor plates;
   a plurality of magnetic insert rings, each magnetic insert ring inserted in each hole in each magnetic conductor plate and aligned with this hole;
   a plurality of gaps, each gap inserted between the outer sidewall of each magnetic insert ring and the inner sidewall of each hole in each magnetic conductor plate;
   wherein a plurality of sub-lens modules are formed, each sub-lens module includes a pair of the aligned holes in the upper magnetic conductor plate and the lower magnetic conductor plate, a pair of the magnetic insert rings respectively inserted in each of this pair of holes and the gaps between the inner sidewall of each of this pair of holes and the outer sidewall of each of this pair of magnetic insert rings, and the pair of the magnetic insert rings function as a pair of magnetic pole pieces of the sub-lens; and
   a common excitation coil, the coil provides magnetic flux to the plurality of sub-lens modules, wherein each sub-lens module focuses a charged particle beam.

2. The multi-axis magnetic lens of claim 1, wherein each gap has at least one vacuum layer or is filled with one non-magnetic material layer.

3. The multi-axis magnetic lens of claim 1, further comprising a plurality of magnetic shielding tubes, wherein each shielding tube is aligned with each hole in each sub-lens module from outside and is separated from each magnetic conductor plate by a vacuum gap or a non-magnetic lining.

4. The multi-axis magnetic lens of claim 1, wherein each magnetic insert ring in the upper magnetic conductor plate is extended upward to cover the distance between it and each upper magnetic shielding tube above the upper magnetic conductor plate, and each magnetic insert ring in the lower magnetic conductor plate is extended downward to cover the distance between it and each lower magnetic shielding tube below the lower magnetic conductor plate.

5. The multi-axis magnetic lens of claim 1, wherein the upper magnetic insert ring in the upper magnetic conductor plate is extended downward into the lower magnetic insert ring in the lower magnetic conductor plate.

6. The multi-axis magnetic lens of claim 1, further comprising two magnetic shielding houses respectively above the upper magnetic conductor plate and below the lower magnetic conductor plate.

7. The multi-axis magnetic lens of claim 3, wherein the magnetic shielding tubes on the sample side of the pair of the magnetic conductor plates are replaced by a magnetic shielding plate.

8. The multi-axis magnetic lens of claim 6, wherein the magnetic shielding house on one side of the pair of the magnetic conductor plates is replaced by a magnetic shielding plate.

9. The multi-axis magnetic lens of claim 2, wherein each gap has same thicknesses of non-magnetic material layer.

10. The multi-axis magnetic lens of claim 2, wherein each gap has a different thickness of non-magnetic material layer.

11. The multi-axis magnetic lens of claim 1, wherein each gap includes a multilayer.

12. The multi-axis magnetic lens of claim 11, wherein the multilayer comprises at least one magnetic layer sandwiched between two non-magnetic layers.

13. The multi-axis magnetic lens of claim 12, wherein the magnetic layer and one of the two non-magnetic layers are interleaved.

14. A plurality of sub-lens modules formed in a pair of parallel magnetic conductor plates, wherein a plurality of charged particle beam pass through holes, wherein each hole in the upper plate of the pair of parallel magnetic conductor plates is aligned with the corresponding hole in the lower plate of the pair of parallel magnetic conductor plates, said plurality of sub-lens modules comprising:
  a plurality of magnetic insert rings, each magnetic insert ring inserted in each hole in each magnetic conductor plate and aligned with this hole; and
  a plurality of gaps, each gap inserted between the outer sidewall of each magnetic insert ring and the inner sidewall of each hole in each magnetic conductor plate,
  wherein each pair of the magnetic insert rings functions as a pair of magnetic pole pieces of the sub-lens module.

* * * * *